US012614572B2

(12) United States Patent
Lee et al.

(10) Patent No.: US 12,614,572 B2
(45) Date of Patent: Apr. 28, 2026

(54) SEMICONDUCTOR APPARATUS AND A SEMICONDUCTOR SYSTEM CAPABLE OF PERFORMING A TRAINING OPERATION

(71) Applicant: SK hynix Inc., Icheon-si (KR)

(72) Inventors: Gang Sik Lee, Icheon-si (KR); Young Taek Kim, Icheon-si (KR); Jae Hyeok Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 155 days.

(21) Appl. No.: 18/518,035

(22) Filed: Nov. 22, 2023

(65) Prior Publication Data

US 2024/0371419 A1 Nov. 7, 2024

(30) Foreign Application Priority Data

May 4, 2023 (KR) ........................ 10-2023-0058645

(51) Int. Cl.
G06F 3/06 (2006.01)
G11C 7/10 (2006.01)
(52) U.S. Cl.
CPC .......... G11C 7/1048 (2013.01); G06F 3/0623 (2013.01); G06F 3/0655 (2013.01); G06F 3/0679 (2013.01)
(58) Field of Classification Search
CPC ... G11C 7/1048; G06F 3/0623; G06F 3/0655; G06F 3/0679
USPC ..................................................... 365/189.18
See application file for complete search history.

(56) References Cited

U.S. PATENT DOCUMENTS

| | | | | |
|---|---|---|---|---|
| 7,158,058 B1* | 1/2007 | Yu | .......... | H03M 5/145 |
| | | | | 341/59 |
| 8,321,732 B2 | 11/2012 | Warner et al. | | |
| 8,897,453 B2* | 11/2014 | Tupala | ................ | H04L 27/2676 |
| | | | | 380/255 |
| 2006/0203927 A1* | 9/2006 | Tzannes | ............ | H04L 25/03872 |
| | | | | 375/260 |
| 2009/0252326 A1 | 10/2009 | Buchmann et al. | | |
| 2011/0156934 A1* | 6/2011 | Bae | .......... | H04L 25/14 |
| | | | | 341/58 |
| 2011/0299581 A1 | 12/2011 | Le-Gall | | |
| 2014/0119413 A1* | 5/2014 | Kim | ........ | H04L 9/065 |
| | | | | 375/219 |
| 2015/0055727 A1* | 2/2015 | Kim | ........ | H04H 20/59 |
| | | | | 375/295 |
| 2017/0117979 A1* | 4/2017 | Sengoku | ............... | H04J 3/0605 |
| 2017/0336974 A1* | 11/2017 | Lo | ........... | G06F 11/08 |
| 2021/0200688 A1* | 7/2021 | Park | ................... | G06F 12/0246 |
| 2021/0365545 A1* | 11/2021 | Kumar | ................. | G06F 21/755 |

* cited by examiner

*Primary Examiner* — Ly D Pham
(74) *Attorney, Agent, or Firm* — WILLIAM PARK AND ASSOCIATES LTD.

(57) ABSTRACT

A semiconductor apparatus includes a Pseudo Random Binary Sequence (PRBS) generation circuit, a first data input and output circuit, and a second data input and output circuit. The PRBS generation circuit generates a PRBS signal and the first and second data input and output circuits receive in common the PRBS signal. The first data input and output circuit scrambles, based on a first scramble code, the PRBS signal to generate a first output data signal and the second data input and output circuit scrambles, based on a second scramble code having different value from the first scramble code, the PRBS signal to generate a second output data signal.

28 Claims, 10 Drawing Sheets

Figure 7A:
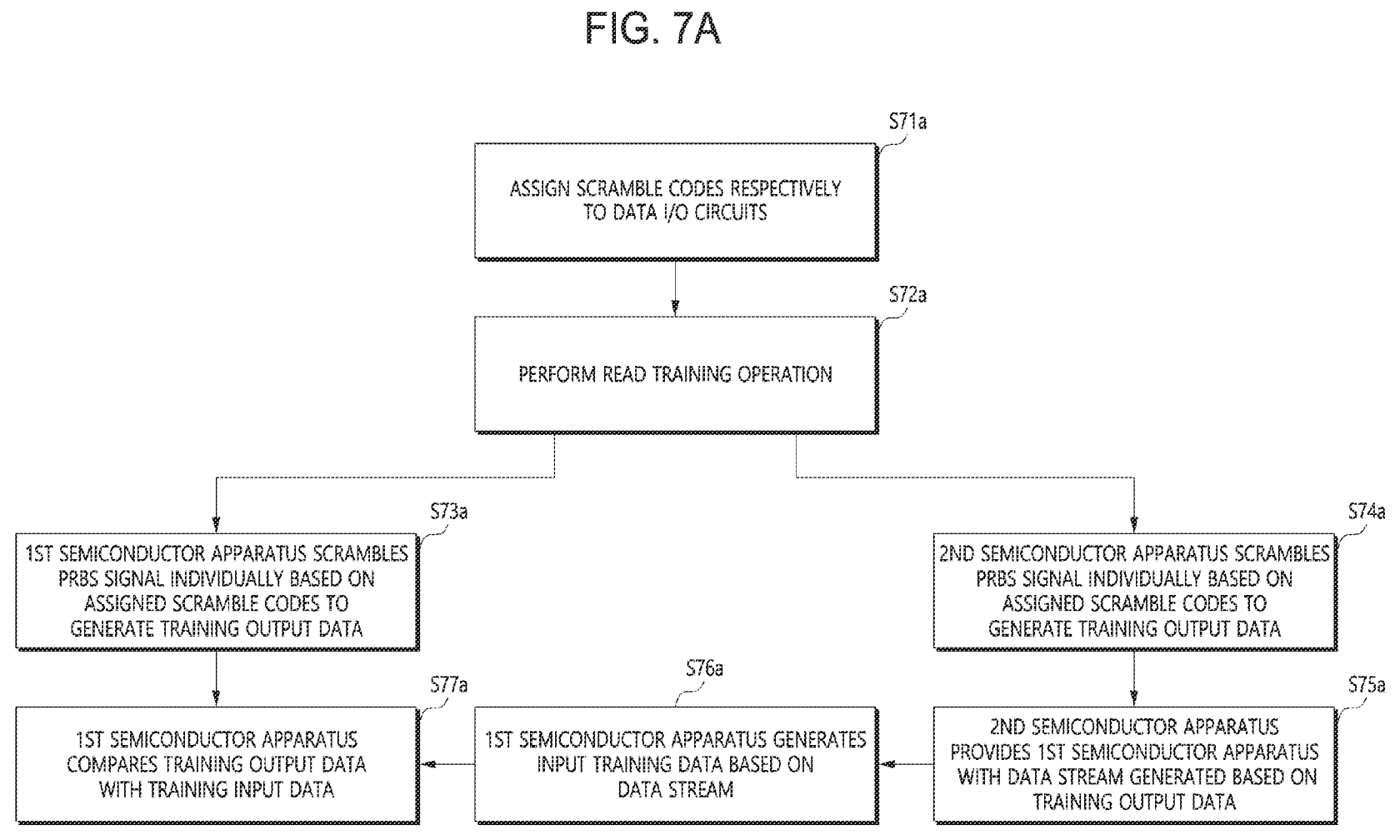

ASSIGN SCRAMBLE CODES RESPECTIVELY TO DATA I/O CIRCUITS

S72a

PERFORM READ TRAINING OPERATION

S73a

1ST SEMICONDUCTOR APPARATUS SCRAMBLES PRBS SIGNAL INDIVIDUALLY BASED ON ASSIGNED SCRAMBLE CODES TO GENERATE TRAINING OUTPUT DATA

S74a

2ND SEMICONDUCTOR APPARATUS SCRAMBLES PRBS SIGNAL INDIVIDUALLY BASED ON ASSIGNED SCRAMBLE CODES TO GENERATE TRAINING OUTPUT DATA

S75a

2ND SEMICONDUCTOR APPARATUS PROVIDES 1ST SEMICONDUCTOR APPARATUS WITH DATA STREAM GENERATED BASED ON TRAINING OUTPUT DATA

S76a

1ST SEMICONDUCTOR APPARATUS GENERATES INPUT TRAINING DATA BASED ON DATA STREAM

S77a

1ST SEMICONDUCTOR APPARATUS COMPARES TRAINING OUTPUT DATA WITH TRAINING INPUT DATA

FIG. 7B

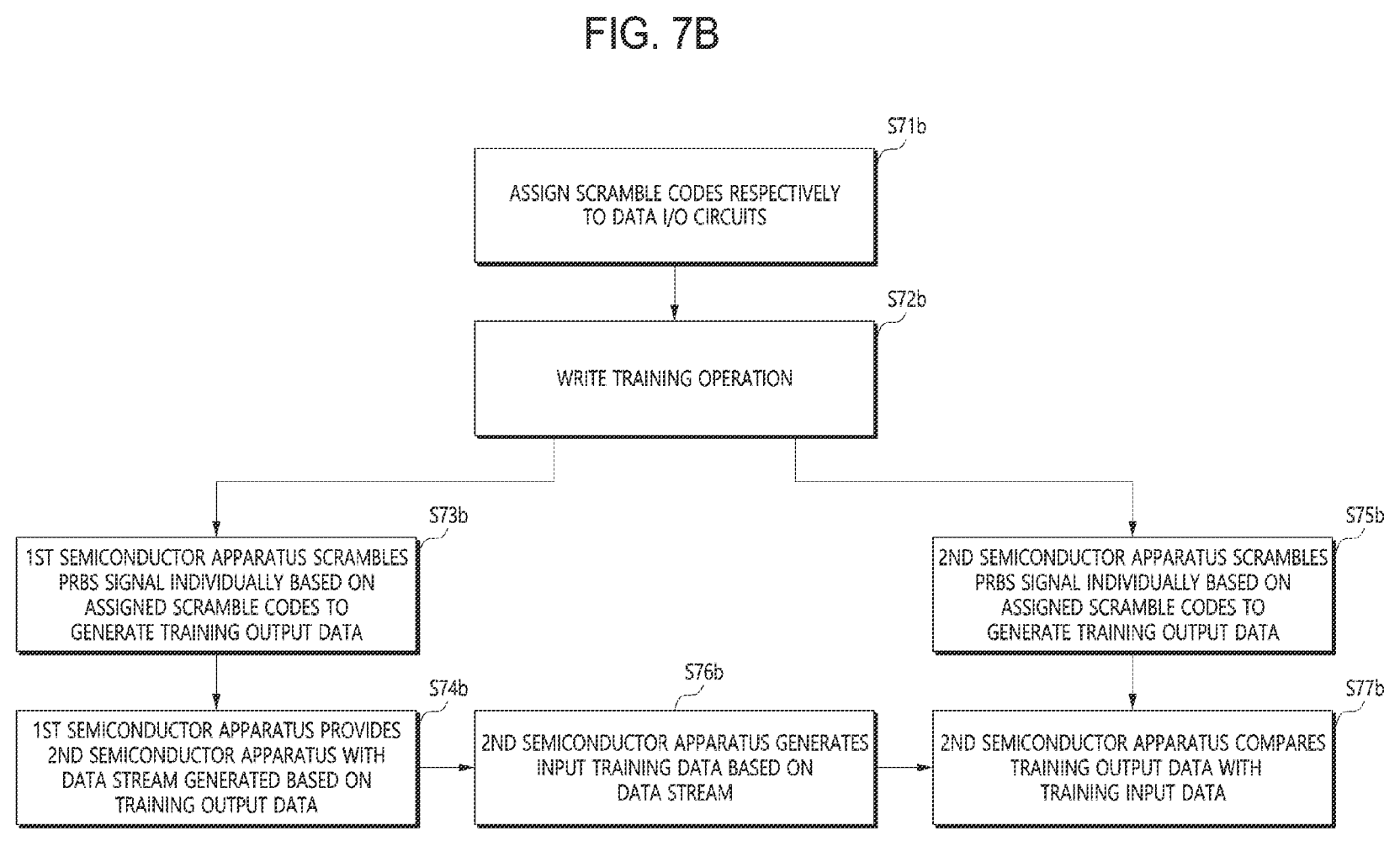

S71b — ASSIGN SCRAMBLE CODES RESPECTIVELY TO DATA I/O CIRCUITS

S72b — WRITE TRAINING OPERATION

S73b — 1ST SEMICONDUCTOR APPARATUS SCRAMBLES PRBS SIGNAL INDIVIDUALLY BASED ON ASSIGNED SCRAMBLE CODES TO GENERATE TRAINING OUTPUT DATA

S74b — 1ST SEMICONDUCTOR APPARATUS PROVIDES 2ND SEMICONDUCTOR APPARATUS WITH DATA STREAM GENERATED BASED ON TRAINING OUTPUT DATA

S75b — 2ND SEMICONDUCTOR APPARATUS SCRAMBLES PRBS SIGNAL INDIVIDUALLY BASED ON ASSIGNED SCRAMBLE CODES TO GENERATE TRAINING OUTPUT DATA

S76b — 2ND SEMICONDUCTOR APPARATUS GENERATES INPUT TRAINING DATA BASED ON DATA STREAM

S77b — 2ND SEMICONDUCTOR APPARATUS COMPARES TRAINING OUTPUT DATA WITH TRAINING INPUT DATA

SEMICONDUCTOR APPARATUS AND A SEMICONDUCTOR SYSTEM CAPABLE OF PERFORMING A TRAINING OPERATION

CROSS-REFERENCES TO RELATED APPLICATION

The present application claims priority under 35 U.S.C. § 119 a to Korean application number 10-2023-0058645, filed on May 4, 2023, in the Korean Intellectual Property Office, which is incorporated herein by reference in its entirety.

BACKGROUND

1. Technical Field

Various embodiments generally relate to integrated circuit technology, and more specifically, to a semiconductor apparatus and a semiconductor system capable of performing a training operation.

2. Related Art

An electronic device includes numerous electronic components. For example, a computer system may include many semiconductor apparatuses composed of semiconductors.

Semiconductor apparatuses constituting the computer system may include processors or memory controllers operating as master devices, as well as memory devices operating as slave devices. The master device may provide a command address signal to the slave device and the slave device may receive data from or transmit data to the master device according to the command address signal.

The master device and the slave device may be connected to each other through a plurality of data transmission lines and each of the transmission lines may form an independent data channel. Due to compatibility, operational speed, operational environment of the master and slave devices, or physical characteristic differences among the data channels, the characteristics of data signals transferred through the plurality of data transmission lines may vary. To compensate for the differences in characteristics among the data channels, the master device and the slave device may perform a training operation before performing a normal operation.

SUMMARY

In an embodiment, a semiconductor apparatus may include a Pseudo Random Binary Sequence (PRBS) generation circuit, a first data input and output circuit, and a second data input and output circuit. The PRBS generation circuit may be configured to generate a PRBS signal. The first data input and output circuit may include a first scramble circuit. The first scramble circuit may be configured to scramble, based on a first scramble code, the PRBS signal to generate a first output data signal. The second data input and output circuit may include a second scramble circuit. The second scramble circuit may be configured to scramble, based on a second scramble code having different value from the first scramble code, the PRBS signal to generate a second output data signal.

In an embodiment, a semiconductor system may include a first semiconductor apparatus and a second semiconductor apparatus. The second semiconductor apparatus may be coupled to the first semiconductor apparatus through a first data transmission line and a second data transmission line. The first semiconductor apparatus may include a first Pseudo Random Binary Sequence (PRBS) generation circuit, a first data input and output circuit, and a second data input and output circuit. The first PRBS generation circuit may be configured to generate a PRBS signal. The first data input and output circuit may be coupled to the first data transmission line and may be configured to be assigned with a first scramble code and configured to scramble, based on the first scramble code, the PRBS signal to generate a first output data signal. The second data input and output circuit may be coupled to the second data transmission line and may be configured to be assigned with a second scramble code and configured to scramble, based on the second scramble code, the PRBS signal to generate a second output data signal.

In an embodiment, a semiconductor apparatus may include a Pseudo Random Binary Sequence (PRBS) generation circuit, a first data input and output circuit, and a second data input and output circuit. The PRBS generation circuit may be configured to generate a PRBS signal. The first data input and output circuit may be configured to be assigned with a first scramble code, configured to scramble, based on a first part of the first scramble code, the PRBS signal to generate a first scrambled signal and configured to scramble, based on a second part of the first scramble code, the first scrambled signal to generate a first output data signal. The second data input and output circuit may be configured to be assigned with a second scramble code, configured to scramble, based on a first part of the second scramble code, the PRBS signal to generate a second scrambled signal and configured to scramble, based on a second part of the second scramble code, the second scrambled signal to generate a second output data signal.

In an embodiment, a semiconductor apparatus may include a Pseudo Random Binary Sequence (PRBS) generation circuit, a first data input and output circuit, a second data input and output circuit, and a data encoding circuit. The PRBS generation circuit may be configured to generate a PRBS signal. The first data input and output circuit may be configured to be assigned with a first scramble code and configured to scramble, based on at least a part of the first scramble code, the PRBS signal to generate a first output data signal. The second data input and output circuit may be configured to be assigned with a second scramble code and configured to scramble, based on at least a part of the second scramble code, the PRBS signal to generate a second output data signal. The data encoding circuit may be configured to encode the first output data signal and the second output data signal to generate a first output symbol and a second output symbol.

BRIEF DESCRIPTION OF THE DRAWINGS

FIGS. 7A and 7B are flowcharts illustrating an operation of a semiconductor system in accordance with an embodiment.

DETAILED DESCRIPTION

Figure 1:
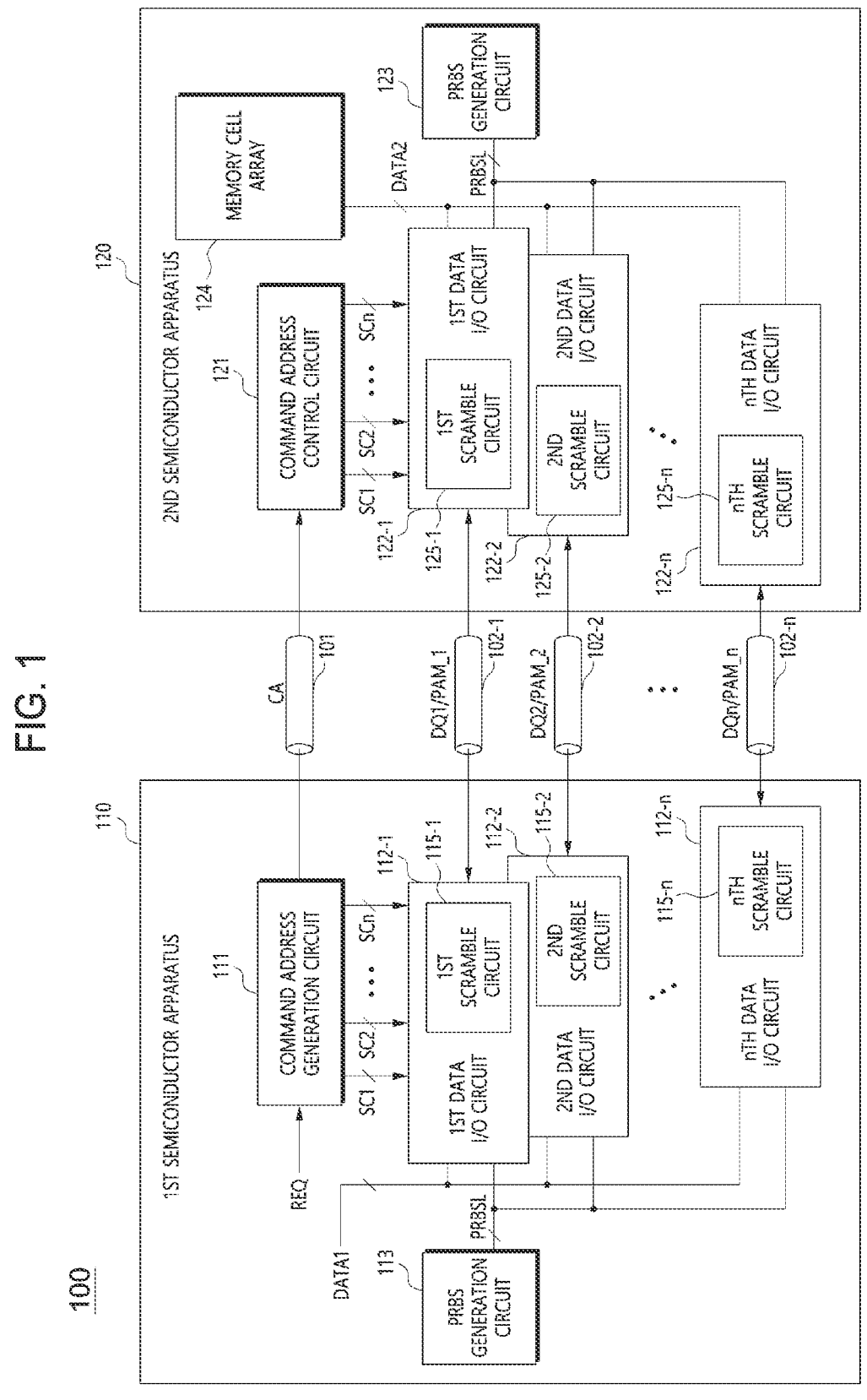
FIG. 1 is a diagram illustrating a configuration of a semiconductor system in accordance with an embodiment.

FIG. 1 is a diagram illustrating a configuration of a semiconductor system 100 in accordance with an embodiment. Referring to FIG. 1, the semiconductor system 100 may include a first semiconductor apparatus 110 and a second semiconductor apparatus 120. The first semiconductor apparatus 110 may be a master device configured to provide various control signals required for the operation of the second semiconductor apparatus 120. The second semiconductor apparatus 120 may be a slave device configured to perform various operations under the control of the first semiconductor apparatus 110. The first semiconductor apparatus 110 may include various types of host devices. For example, the first semiconductor apparatus 110 may include a central processing unit (CPU), a graphic processing unit (GPU), a multimedia processor (MMP), a digital signal processor (DSP), an application processor (AP), a memory controller, and so forth. For example, the second semiconductor apparatus 120 may be a memory device including volatile memory and non-volatile memory. The volatile memory may include Static Random-Access Memory (SRAM), Dynamic RAM (DRAM), and Synchronous DRAM (SDRAM). The non-volatile memory may include Read Only Memory (ROM), Programmable ROM (PROM), Electrically Erasable and Programmable ROM (EEPROM), Erasable Programmable ROM (EPROM), flash memory, Phase Change RAM (PRAM), Magnetic RAM (MRAM), Resistive RAM (RRAM), and Ferroelectric RAM (FRAM).

The second semiconductor apparatus 120 may be connected to the first semiconductor apparatus 110 through a plurality of buses. The plurality of buses may consist of a signal transmission paths, a link, or a channel for transmitting a signal. The plurality of buses may include a command address bus 101 and data buses 102-1 to 102-n. The command address bus 101 may be a unidirectional bus from the first semiconductor apparatus 110 to the second semiconductor apparatus 120 while the data buses 102-1 to 102-n may be bidirectional between the first semiconductor apparatus 110 and the second semiconductor apparatus 120. The second semiconductor apparatus 120 may be connected to the first semiconductor apparatus 110 through the command address bus 101 and may receive a command address signal CA transmitted from the first semiconductor apparatus 110. The command address signal CA may be of multiple bits. The second semiconductor apparatus 120 may also be connected to the first semiconductor apparatus 110 through the data buses 102-1 to 102-n and, through the data buses 102-1 to 102-n, may receive data streams DQ1 to DQn transmitted from the first semiconductor apparatus 110 and may transmit the data streams DQ1 to DQn to the first semiconductor apparatus 110. In an embodiment, the semiconductor system 100 may perform multi-level signal transmission. Through the data buses 102-1 to 102-n, the second semiconductor apparatus 120 may receive Pulse Amplitude Modulation (PAM) signals PAM_1 to PAM_n transmitted from the first semiconductor apparatus 110 and may transmit the PAM signals PAM_1 to PAM_n to the first semiconductor apparatus 110. The PAM signals PAM_1 to PAM_n may be multi-level voltage signals including data information of multiple bits. The PAM signals PAM_1 to PAM_n may include at least one of a PAM 3 and a PAM 4. The PAM 3 may be a PAM signal having three distinct voltage levels and the PAM 4 may be a PAM signal having four distinct voltage levels. The data buses 102-1 to 102-n may include a plurality of data transmission lines. For instance, the data buses may include a 'n' number of data transmission lines, 'n' being an integer greater than or equal to three (3). Each of the first to n-th data transmission lines 102-1 to 102-n may transmit an independent data stream or an independent PAM signal. The first data transmission line 102-1 may transmit the first data stream DQ1 or the first PAM signal PAM_1. The second data transmission line 102-2 may transmit the second data stream DQ2 or the second PAM signal PAM_2. The n-th data transmission line 102-n may transmit the n-th data stream DQn or the n-th PAM signal PAM_n.

Although not illustrated, the plurality of buses may further include a clock bus. The clock bus may be a unidirectional bus from the first semiconductor apparatus 110 to the second semiconductor apparatus 120. The first semiconductor apparatus 110 may transmit a clock signal to the second semiconductor apparatus 120 through the clock bus. In synchronization with the clock signal, the first semiconductor apparatus 110 may transmit the command address signal CA to the second semiconductor apparatus 120. In synchronization with the clock signal, the first semiconductor apparatus 110 may transmit the data streams DQ1 to DQn or the PAM signals PAM_1 to PAM_n to the second semiconductor apparatus 120. In synchronization with the clock signal, the second semiconductor apparatus 120 may transmit the data streams DQ1 to DQn or the PAM signals PAM_1 to PAM_n to the first semiconductor apparatus 110.

The first semiconductor apparatus 110 may include a command address generation circuit 111 and a plurality of data input and output circuits 112-1 to 112-n. The command address generation circuit 111 may generate the command address signal CA in response to a request REQ. The command address generation circuit 111 may be connected to the command address bus 101 and may transmit the command address signal CA to the second semiconductor apparatus 120 through the command address bus 101. Depending on a type of the request REQ, the command address generation circuit 111 may generate the command address signal CA instructing various operations of the second semiconductor apparatus 120. For example, in response to the request REQ for mode setting of the second semiconductor apparatus 120, the command address generation circuit 111 may generate the command address signal CA for the mode setting of the second semiconductor apparatus 120. In response to the command address signal CA, the second semiconductor apparatus 120 may set various parameters associated with operations of the second semiconductor apparatus 120. In an embodiment, the second semiconductor apparatus 120 may store, in a mode register set, information related to the various parameters. In response to the request REQ related to a training operation, the command address generation circuit 111 may generate the command address signal CA for the training operation between the first semiconductor apparatus 110 and the second semiconductor apparatus 120. In response to the request REQ associated with a normal operation, the command address generation circuit 111 may generate the command address signal CA for the normal operation between the first semiconductor apparatus 110 and the second semiconductor apparatus 120. Based on the command address signal CA for the mode setting, the command address generation circuit 111 may generate a plurality of scramble codes SC1 to SCn. The number of the plurality of scramble codes SC1 to SCn may be substantially the same as the number of the plurality of data input and output circuits 112-1 to 112-n.

The number of the plurality of data input and output circuits 112-1 to 112-n may be substantially the same as the number of the plurality of data transmission lines 102-1 to 102-n. For example, the first semiconductor apparatus 110 may include first to n-th data input and output circuits 112-1 to 112-n. The first to n-th data input and output circuits 112-1 to 112-n may be connected to the first to n-th data transmission lines 102-1 to 102-n on the one-to-one basis. The first data input and output circuit 112-1 may be connected to the first data transmission line 102-1, the second data input and output circuit 112-2 may be connected to the second data transmission line 102-2 and the n-th data input and output circuit 112-n may be connected to the n-th data transmission line 102-n. The first data input and output circuit 112-1 may generate the first data stream DQ1 or the first PAM signal PAM_1 based on normal data DATA1 of the first semiconductor apparatus 110. The first data input and output circuit 112-1 may then transmit the first data stream DQ1 or the first PAM signal PAM_1 to the second semiconductor apparatus 120 through the first data transmission line 102-1. The first data input and output circuit 112-1 may receive the first data stream DQ1 or the first PAM signal PAM_1 transmitted from the second semiconductor apparatus 120 through the first data transmission line 102-1. Based on the first data stream DQ1 or the first PAM signal PAM_1, the first data input and output circuit 112-1 may generate the normal data DATA1 of the first semiconductor apparatus 110. The second data input and output circuit 112-2 may generate the second data stream DQ2 or the second PAM signal PAM_2 based on the normal data DATA1 of the first semiconductor apparatus 110. The second data input and output circuit 112-2 may then transmit the second data stream DQ2 or the second PAM signal PAM_2 to the second semiconductor apparatus 120 through the second data transmission line 102-2. The second data input and output circuit 112-2 may receive the second data stream DQ2 or the second PAM signal PAM_2 transmitted from the second semiconductor apparatus 120 through the second data transmission line 102-2. Based on the second data stream DQ2 or the second PAM signal PAM_2, the second data input and output circuit 112-2 may generate the normal data DATA1 of the first semiconductor apparatus 110. The n-th data input and output circuit 112-n may generate the n-th data stream DQn or the n-th PAM signal PAM_n based on the normal data DATA1 of the first semiconductor apparatus 110. The n-th data input and output circuit 112-n may then transmit the n-th data stream DQn or the n-th PAM signal PAM_n to the second semiconductor apparatus 120 through the n-th data transmission line 102-n. The n-th data input and output circuit 112-n may receive the n-th data stream DQn or the n-th PAM signal PAM_n transmitted from the second semiconductor apparatus 120 through the n-th data transmission line 102-n. Based on the n-th data stream DQn or the n-th PAM signal PAM_n, the n-th data input and output circuit 112-n may generate the normal data DATA1 of the first semiconductor apparatus 110.

The first semiconductor apparatus 110 may further include a Pseudo Random Binary Sequence (PRBS) generation circuit 113. The PRBS generation circuit 113 may generate a PRBS signal PRBSL. The PRBS generation circuit 113 may generate, based on an arbitrary seed signal, the PRBS signal PRBSL having various patterns. The PRBS signal PRBSL may be a source signal for generating training data to be used in a training operation between the first semiconductor apparatus 110 and the second semiconductor apparatus 120. During an operation other than the training operation, the first to n-th data input and output circuits 112-1 to 112-n may generate, from the normal data DATA1, the data streams DQ1 to DQn or the PAM signals PAM_1 to PAM_n and may generate the normal data DATA1 from the data streams DQ1 to DQn or the PAM signals PAM_1 to PAM_n. During the training operation, the first to n-th data input and output circuits 112-1 to 112-n may commonly receive the PRBS signal PRBSL. The first to n-th data input and output circuits 112-1 to 112-n might not receive the normal data DATA1 or might not generate the normal data DATA1. The first to n-th data input and output circuits 112-1 to 112-n may scramble the PRBS signal PRBSL to generate training data having different patterns from each other.

The first data input and output circuit 112-1 may be assigned with the first scramble code SC1. The first data input and output circuit 112-1 may receive the first scramble code SC1 from the command address generation circuit 111 and may scramble, based on the first scramble code SC1, the PRBS signal PRBSL to generate first training output data. The first data input and output circuit 112-1 may generate the first data stream DQ1 or the first PAM signal PAM_1 based on the first training output data. The first data input and output circuit 112-1 may generate first training input data based on the first data stream DQ1 or the first PAM signal PAM_1 transmitted from the second semiconductor apparatus 120. The first data input and output circuit 112-1 may perform a training operation by comparing the first training input data with the first training output data. For instance, when the first training input data is the same as the first training output data, the first data input and output circuit 112-1 may determine a result of the training operation as "pass." When the first training input data is different from the first training output data, the first data input and output circuit 112-1 may determine the result of the training operation as "fail." The first data input and output circuit 112-1 may include a first scramble circuit 115-1. The first scramble circuit 115-1 may scramble the PRBS signal PRBSL based on the first scramble code SC1.

The second data input and output circuit 112-2 may be assigned with the second scramble code SC2. The second scramble code SC2 may have different value from the first scramble code SC1. The second data input and output circuit 112-2 may receive the second scramble code SC2 from the command address generation circuit 111 and may scramble, based on the second scramble code SC2, the PRBS signal PRBSL to generate second training output data. The second data input and output circuit 112-2 may generate the second data stream DQ2 or the second PAM signal PAM_2 based on the second training output data. The second data input and output circuit 112-2 may generate second training input data based on the second data stream DQ2 or the second PAM signal PAM_2 transmitted from the second semiconductor apparatus 120. The second data input and output circuit 112-2 may perform a training operation by comparing the second training input data with the second training output data. For instance, when the second training input data is the same as the second training output data, the second data input and output circuit 112-2 may determine a result of the training operation as "pass." When the second training input data is different from the second training output data, the second data input and output circuit 112-2 may determine the result of the training operation as "fail." The second data input and output circuit 112-2 may include a second scramble circuit 115-2. The second scramble circuit 115-2 may scramble the PRBS signal PRBSL based on the second scramble code SC2.

The n-th data input and output circuit 112-*n* may be assigned with the n-th scramble code SCn. The n-th scramble code SCn may have different value from any of the first scramble code SC1 and the second scramble code SC2. The n-th scramble code SCn may have the same value as one of the first scramble code SC1 and the second scramble code SC2. The n-th data input and output circuit 112-*n* may receive the n-th scramble code SCn from the command address generation circuit 111 and may scramble, based on the n-th scramble code SCn, the PRBS signal PRBSL to generate n-th training output data. The n-th data input and output circuit 112-*n* may generate the n-th data stream DQn or the n-th PAM signal PAM_n based on the n-th training output data. The n-th data input and output circuit 112-*n* may generate n-th training input data based on the n-th data stream DQn or the n-th PAM signal PAM_n transmitted from the second semiconductor apparatus 120. The n-th data input and output circuit 112-*n* may perform a training operation by comparing the n-th training input data with the n-th training output data. For instance, when the n-th training input data is the same as the n-th training output data, the n-th data input and output circuit 112-*n* may determine a result of the training operation as "pass." When the n-th training input data is different from the n-th training output data, the n-th data input and output circuit 112-*n* may determine the result of the training operation as "fail." The n-th data input and output circuit 112-*n* may include a n-th scramble circuit 115-*n*. The n-th scramble circuit 115-*n* may scramble the PRBS signal PRBSL based on the n-th scramble code SCn.

The second semiconductor apparatus 120 may include a command address control circuit 121 and a plurality of data input and output circuits 122-1 to 122-*n*. The command address control circuit 121 may be connected to the first semiconductor apparatus 110 through the command address bus 101 and may receive the command address signal CA transmitted from the first semiconductor apparatus 110 through the command address bus 101. The command address control circuit 121 may decode the command address signal CA to generate various internal control signals for the second semiconductor apparatus 120 to perform various operations. The command address control circuit 121 may generate, based on the command address signal CA for mode setting, an internal data signal to set a parameter of the second semiconductor apparatus 120. For example, the command address control circuit 121 may generate a plurality of scramble codes SC1 to SCn based on the command address signal CA. The number of the plurality of scramble codes SC1 to SCn may be substantially the same as the number of the plurality of data input and output circuits 122-1 to 122-*n*. Values of the plurality of scramble codes SC1 to SCn may be the same as respective values of the plurality of scramble codes SC1 to SCn generated from the command address generation circuit 111.

The second semiconductor apparatus 120 may include first to n-th data input and output circuits 122-1 to 122-*n*. The first to n-th data input and output circuits 122-1 to 122-*n* may be connected to the first to n-th data transmission lines 102-1 to 102-*n* on the one-to-one basis. The first data input and output circuit 122-1 may be connected to the first data transmission line 102-1, the second data input and output circuit 122-2 may be connected to the second data transmission line 102-2 and the n-th data input and output circuit 122-*n* may be connected to the n-th data transmission line 102-*n*. The first data input and output circuit 122-1 may generate the first data stream DQ1 or the first PAM signal PAM_1 based on normal data DATA2 of the second semiconductor apparatus 120. The first data input and output circuit 122-1 may then transmit the first data stream DQ1 or the first PAM signal PAM_1 to the first semiconductor apparatus 110 through the first data transmission line 102-1. The first data input and output circuit 122-1 may receive the first data stream DQ1 or the first PAM signal PAM_1 transmitted from the first semiconductor apparatus 110 through the first data transmission line 102-1. Based on the first data stream DQ1 or the first PAM signal PAM_1, the first data input and output circuit 122-1 may generate the normal data DATA2 of the second semiconductor apparatus 120. The second data input and output circuit 122-2 may generate the second data stream DQ2 or the second PAM signal PAM_2 based on the normal data DATA2 of the second semiconductor apparatus 120. The second data input and output circuit 122-2 may then transmit the second data stream DQ2 or the second PAM signal PAM_2 to the first semiconductor apparatus 110 through the second data transmission line 102-2. The second data input and output circuit 122-2 may receive the second data stream DQ2 or the second PAM signal PAM_2 transmitted from the first semiconductor apparatus 110 through the second data transmission line 102-2. Based on the second data stream DQ2 or the second PAM signal PAM_2, the second data input and output circuit 122-2 may generate the normal data DATA2 of the second semiconductor apparatus 120. The n-th data input and output circuit 122-*n* may generate the n-th data stream DQn or the n-th PAM signal PAM_n based on the normal data DATA2 of the second semiconductor apparatus 120. The n-th data input and output circuit 122-*n* may then transmit the n-th data stream DQn or the n-th PAM signal PAM_n to the first semiconductor apparatus 110 through the n-th data transmission line 102-*n*. The n-th data input and output circuit 122-*n* may receive the n-th data stream DQn or the n-th PAM signal PAM_n transmitted from the first semiconductor apparatus 110 through the n-th data transmission line 102-*n*. Based on the n-th data stream DQn or the n-th PAM signal PAM_n, the n-th data input and output circuit 122-*n* may generate the normal data DATA2 of the second semiconductor apparatus 120.

The second semiconductor apparatus 120 may further include a PRBS generation circuit 123. The PRBS generation circuit 123 may generate a PRBS signal PRBSL. The PRBS generation circuit 123 may have substantially the same structure as the PRBS generation circuit 113 and may perform substantially the same function as the PRBS generation circuit 113. The PRBS signal PRBSL generated from the PRBS generation circuit 123 may be substantially the same as the PRBS signal PRBSL generated from the PRBS generation circuit 113. During an operation other than the training operation, the first to n-th data input and output circuits 122-1 to 122-*n* may generate, from the normal data DATA2, the data streams DQ1 to DQn or the PAM signals PAM_1 to PAM_n and may generate the normal data DATA2 from the data streams DQ1 to DQn or the PAM signals PAM_1 to PAM_n. During the training operation, the first to n-th data input and output circuits 122-1 to 122-*n* may commonly receive the PRBS signal PRBSL. The first to n-th data input and output circuits 122-1 to 122-*n* might not receive the normal data DATA2 or might not generate the normal data DATA2. The first to n-th data input and output circuits 122-1 to 122-*n* may scramble the PRBS signal PRBSL to generate training data having different patterns from each other.

The first data input and output circuit 122-1 may be assigned with the first scramble code SC1. The first data input and output circuit 122-1 may receive the first scramble code SC1 from the command address control circuit 121 and may scramble, based on the first scramble code SC1, the PRBS signal PRBSL to generate first training output data. The first data input and output circuit 122-1 may generate the first data stream DQ1 or the first PAM signal PAM_1 based on the first training output data. The first data input and output circuit 122-1 may generate first training input data based on the first data stream DQ1 or the first PAM signal PAM_1 transmitted from the first semiconductor apparatus 110. The first data input and output circuit 122-1 may perform a training operation by comparing the first training input data with the first training output data. For instance, when the first training input data is the same as the first training output data, the first data input and output circuit 122-1 may determine a result of the training operation as "pass." When the first training input data is different from the first training output data, the first data input and output circuit 122-1 may determine the result of the training operation as "fail." The first data input and output circuit 122-1 may include a first scramble circuit 125-1. The first scramble circuit 125-1 may scramble the PRBS signal PRBSL based on the first scramble code SC1.

The second data input and output circuit 122-2 may be assigned with the second scramble code SC2. The second data input and output circuit 122-2 may receive the second scramble code SC2 from the command address control circuit 121 and may scramble, based on the second scramble code SC2, the PRBS signal PRBSL to generate second training output data. The second data input and output circuit 122-2 may generate the second data stream DQ2 or the second PAM signal PAM_2 based on the second training output data. The second data input and output circuit 122-2 may generate second training input data based on the second data stream DQ2 or the second PAM signal PAM_2 transmitted from the first semiconductor apparatus 110. The second data input and output circuit 122-2 may perform a training operation by comparing the second training input data with the second training output data. For instance, when the second training input data is the same as the second training output data, the second data input and output circuit 122-2 may determine a result of the training operation as "pass." When the second training input data is different from the second training output data, the second data input and output circuit 122-2 may determine the result of the training operation as "fail." The second data input and output circuit 122-2 may include a second scramble circuit 125-2. The second scramble circuit 125-2 may scramble the PRBS signal PRBSL based on the second scramble code SC2.

The n-th data input and output circuit 122-n may be assigned with the n-th scramble code SCn. The n-th data input and output circuit 122-n may receive the n-th scramble code SCn from the command address control circuit 121 and may scramble, based on the n-th scramble code SCn, the PRBS signal PRBSL to generate n-th training output data. The n-th data input and output circuit 122-n may generate the n-th data stream DQn or the n-th PAM signal PAM_n based on the n-th training output data. The n-th data input and output circuit 122-n may generate n-th training input data based on the n-th data stream DQn or the n-th PAM signal PAM_n transmitted from the first semiconductor apparatus 110. The n-th data input and output circuit 122-n may perform a training operation by comparing the n-th training input data with the n-th training output data. For instance, when the n-th training input data is the same as the n-th training output data, the n-th data input and output circuit 122-n may determine a result of the training operation as "pass." When the n-th training input data is different from the n-th training output data, the n-th data input and output circuit 122-n may determine the result of the training operation as "fail." The n-th data input and output circuit 122-n may include a n-th scramble circuit 125-n. The n-th scramble circuit 125-n may scramble the PRBS signal PRBSL based on the n-th scramble code SCn.

The second semiconductor apparatus 120 may include a memory cell array 124. While not illustrated, the memory cell array 124 may include a plurality of memory cells. The memory cell array 124 may include a plurality of row lines arranged in the row direction and a plurality of column lines arranged in the column direction. The plurality of memory cells may be connected at respective intersections of the plurality of row lines and the plurality of column lines. When a particular row line from the plurality of row lines and a particular column line from the plurality of column lines are selected, a memory cell connected between the selected row line and selected column line may be accessed. The memory cell array 124 may additionally include a row decoding circuit and a column decoding circuit. The row decoding circuit may be configured to select at least one of the plurality of row lines based on the command address signal CA. The column decoding circuit may be configured to select at least one of the plurality of column lines based on the command address signal CA. The memory cell array 124 may be connected to the first to n-th data input and output circuits 122-1 to 122-n. The memory cell array 124 may store, into the plurality of memory cells, the normal data DATA2 provided from the first to n-th data input and output circuits 122-1 to 122-n. The operation of storing the normal data DATA2 into the memory cell array 124 may be a write operation. The memory cell array 124 may read data from the memory cells to generate the normal data DATA2 and may provide the normal data DATA2 to the first to n-th data input and output circuits 122-1 to 122-n. The operation of reading the data from the memory cell array 124 to output the normal data DATA2 may be a read operation. The memory cell array 124 may further include a write circuit configured to write the normal data DATA2 into the memory cells based on the command address signal CA and a read circuit configured to read, based on the command address signal CA, the data from the memory cells to generate the normal data DATA2.

Figure 2:
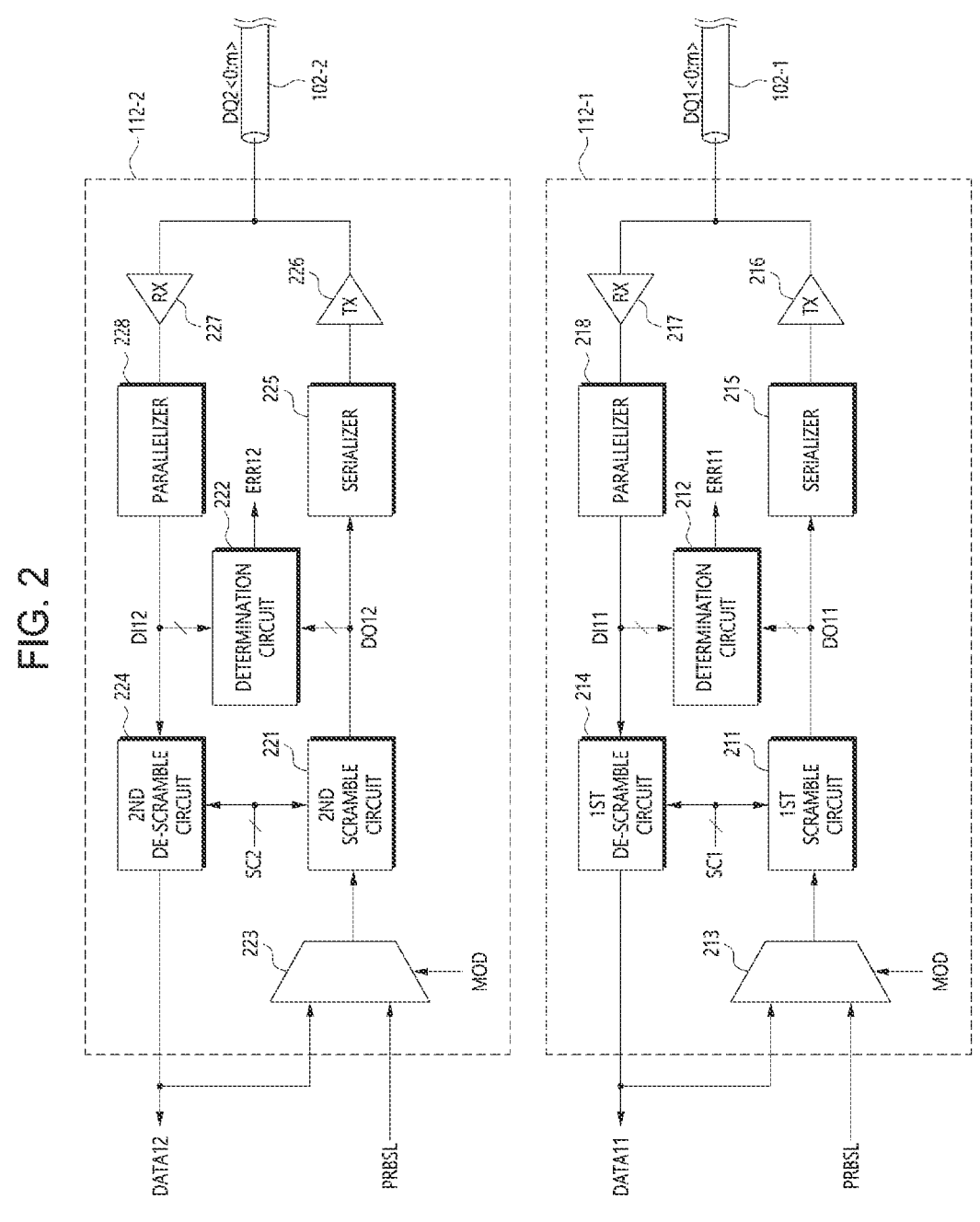
FIG. 2 is a diagram illustrating configurations of a first data input and output circuit and a second data input and output circuit in a first semiconductor apparatus illustrated in FIG. 1.

FIG. 2 is a diagram illustrating configurations of the first data input and output circuit 112-1 and the second data input and output circuit 112-2 in the first semiconductor apparatus 110 illustrated in FIG. 1. Referring to FIG. 2, the first data input and output circuit 112-1 may include a first scramble circuit 211. The first scramble circuit 211 may receive the first scramble code SC1, a partial data DATA11 of the normal data and the PRBS signal PRBSL. The partial data DATA11 of the normal data may be a partial data signal allocated from the normal data DATA1 to the first data input and output circuit 112-1. The first scramble circuit 211 may selectively receive one of the partial data DATA11 of the normal data and the PRBS signal PRBSL. During an operation other than the training operation, the first scramble circuit 211 may generate a first output data signal DO11 by scrambling the partial data DATA11 of the normal data based on the first scramble code SC1. The first output data signal DO11 generated during an operation other than the training operation may be write data. During the training operation, the first scramble circuit 211 may generate the first output data signal DO11 by scrambling the PRBS signal PRBSL based on the first scramble code SC1. The first output data signal DO11 generated during the training operation may be the training output data. The value of the first scramble code SC1, which is set during an operation other than the training operation, may be the same as or different from the value of the first scramble code SC1, which is set during the training operation. The first data input and output circuit 112-1 may generate the first data stream DQ1<0:m>, which is to be transmitted through the first data transmission line 102-1 (see FIG. 1), based on the first output data signal DO11. Here, 'm' may be an integer greater than or equal to 3. The first data input and output circuit 112-1 may transmit the first data stream DQ1<0:m> to the second semiconductor apparatus 120 through the first data transmission line 102-1. The first data input and output circuit 112-1 may receive the first data stream DQ1<0:m> transmitted through the first data transmission line 102-1 and may generate a first input data signal DI11 based on the first data stream DQ1<0:m>. The first input data signal DI11 generated during an operation other than the training operation may be read data. The first input data signal DI11 generated during the training operation may be the training input data. The first data input and output circuit 112-1 may perform a training operation by comparing the first output data signal DO11 with the first input data signal DI11.

The first data input and output circuit 112-1 may further include a determination circuit 212. The determination circuit 212 may receive the first output data signal DO11, which is from the first scramble circuit 211, and the first input data signal DI11, which is generated based on the first data stream DQ1<0:m>. The determination circuit 212 may compare the first output data signal DO11 with the first input data signal DI11. The determination circuit 212 may determine whether the first output data signal DO11 is the same as the first input data signal DI11. The determination circuit 212 may generate an error signal ERR11 by determining whether the first output data signal DO11 is the same as the first input data signal DI11. The determination circuit 212 might not generate the error signal ERR11 when the first output data signal DO11 is the same as the first input data signal DI11. The determination circuit 212 may generate the error signal ERR11 when the first output data signal DO11 is different from the first input data signal DI11. For instance, the determination circuit 212 may individually compare logic values between a bit within the first output data signal DO11 and a corresponding bit within the first input data signal DI11 and may count the number of bits having different logic values to generate the error signal ERR11.

The first data input and output circuit 112-1 may further include a selection circuit 213. The selection circuit 213 may receive a mode signal MOD, the partial data DATA11 of the normal data and the PRBS signal PRBSL. Based on the mode signal MOD, the selection circuit 213 may output one of the partial data DATA11 of the normal data and the PRBS signal PRBSL. The first scramble circuit 211 may scramble the output signal of the selection circuit 213 to generate the first output data signal DO11. For example, when the mode signal MOD is at a high logic level, the selection circuit 213 may output the PRBS signal PRBSL. When the mode signal MOD is at a low logic level, the selection circuit 213 may output the partial data DATA11 of the normal data. The mode signal MOD may have different logic levels according to a type of operation performed by the first semiconductor apparatus 110. When the first semiconductor apparatus 110 performs the training operation, the mode signal MOD may be set to a high logic level. When the first semiconductor apparatus 110 performs an operation other than the training operation, the mode signal MOD may be set to a low logic level. In an embodiment, the mode signal MOD may be generated from the command address generation circuit 111.

The first data input and output circuit 112-1 may further include a first de-scramble circuit 214, a serializer 215, a transmitter 216, a receiver 217, and a parallelizer 218. The first de-scramble circuit 214 may receive the first scramble code SC1 and the first input data signal DI11. Based on the first scramble code SC1, the first de-scramble circuit 214 may de-scramble the first input data signal DI11 to generate the partial data DATA11 of the normal data. The first de-scramble circuit 214 may perform a function opposite to a function performed by the first scramble circuit 211. For instance, when the first scramble circuit 211 scrambles a particular signal based on the first scramble code SC1, the first de-scramble circuit 214 may generate the particular signal by de-scrambling, based on the first scramble code SC1, the signal scrambled by the first scramble circuit 211. The serializer 215 may receive the first output data signal DO11. The serializer 215 may serialize the first output data signal DO11 to generate a serialized data signal. For instance, the serializer 215 may receive, all at once, the first output data signal DO11 of a 'm+1' number of bits and may sequentially output the first to (m+1)-th bits of the serialized data signal. The transmitter 216 may be connected to the serializer 215 and the first data transmission line 102-1 and may receive the serialized data from the serializer 215. Depending on the logic levels of the serialized data signal, the transmitter 216 may drive the first data transmission line 102-1 to transmit the first data stream DQ1<0:m>. The receiver 217 may be connected to the first data transmission line 102-1 and may receive the first data stream DQ1<0:m> transmitted through the first data transmission line 102-1. The parallelizer 218 may receive the first data stream DQ1<0:m> from the receiver 217. The parallelizer 218 may parallelize the first data stream DQ1<0:m> to generate the first input data signal DI11. For example, the parallelizer 218 may sequentially receive the first to (m+1)-th bits of the first data stream DQ1<0:m> and may output, all at once, the first input data signal DI11 of the 'm+1' number of bits.

The second data input and output circuit 112-2 may include substantially the same elements as the first data input and output circuit 112-1. The second data input and output circuit 112-2 may include a second scramble circuit 221, a determination circuit 222, a selection circuit 223, a second de-scramble circuit 224, a serializer 225, a transmitter 226, a receiver 227, and a parallelizer 228. The second scramble circuit 221 may receive the second scramble code SC2, another partial data DATA12 of the normal data and the PRBS signal PRBSL. The another partial data DATA12 of the normal data may be a partial data signal allocated from the normal data DATA1 to the second data input and output circuit 112-2. The second scramble circuit 221 may selectively receive one of the another partial data DATA12 of the normal data and the PRBS signal PRBSL. During an operation other than the training operation, the second scramble circuit 221 may generate a second output data signal DO12 by scrambling the another partial data DATA12 of the normal data based on the second scramble code SC2. The second output data signal DO12 generated during an operation other than the training operation may be the write data. During the training operation, the second scramble circuit 221 may generate the second output data signal DO12 by scrambling the PRBS signal PRBSL based on the second scramble code SC2. The second output data signal DO12 generated during the training operation may be the training output data. The second scramble circuit 221 may have substantially the same structure as the first scramble circuit 211 and may perform substantially the same function as the first scramble circuit 211. The value of the second scramble code SC2, which is set during an operation other than the training operation, may be the same as or different from the value of the second scramble code SC2, which is set during the training operation. The second data input and output circuit 112-2 may generate the second data stream DQ2<0: m>, which is to be transmitted through the second data transmission line 102-2 (see FIG. 1), based on the second output data signal DO12. The second data input and output circuit 112-2 may transmit the second data stream DQ2<0: m> to the second semiconductor apparatus 120 through the second data transmission line 102-2. The second data input and output circuit 112-2 may receive the second data stream DQ2<0:m> transmitted through the second data transmission line 102-2 and may generate a second input data signal DI12 based on the second data stream DQ2<0:m>. The second input data signal DI12 generated during an operation other than the training operation may be the read data. The second input data signal DI12 generated during the training operation may be the training input data. The second data input and output circuit 112-2 may perform a training operation by comparing the second output data signal DO12 with the second input data signal DI12.

The determination circuit 222 may receive the second output data signal DO12, which is from the second scramble circuit 221, and the second input data signal DI12, which is generated based on the second data stream DQ2<0:m>. The determination circuit 222 may compare the second output data signal DO12 with the second input data signal DI12. The determination circuit 222 may determine whether the second output data signal DO12 is the same as the second input data signal DI12. The determination circuit 222 may generate an error signal ERR12 by determining whether the second output data signal DO12 is the same as the second input data signal DI12. The selection circuit 223 may receive the mode signal MOD, the another partial data DATA12 of the normal data and the PRBS signal PRBSL. Based on the mode signal MOD, the selection circuit 223 may output one of the another partial data DATA12 of the normal data and the PRBS signal PRBSL. The second scramble circuit 221 may scramble the output signal of the selection circuit 223 to generate the second output data signal DO12. For example, when the mode signal MOD is at a high logic level, the selection circuit 223 may output the PRBS signal PRBSL. When the mode signal MOD is at a low logic level, the selection circuit 223 may output the another partial data DATA12 of the normal data.

The second de-scramble circuit 224 may receive the second scramble code SC2 and the second input data signal DI12. Based on the second scramble code SC2, the second de-scramble circuit 224 may de-scramble the second input data signal DI12 to generate the another partial data DATA12 of the normal data. The second de-scramble circuit 224 may perform a function opposite to a function performed by the second scramble circuit 221. For instance, when the second scramble circuit 221 scrambles a particular signal based on the second scramble code SC2, the second de-scramble circuit 224 may generate the particular signal by de-scrambling, based on the second scramble code SC2, the signal scrambled by the second scramble circuit 221. The serializer 225 may receive the second output data signal DO12. The serializer 225 may serialize the second output data signal DO12 to generate a serialized data signal. For instance, the serializer 225 may receive, all at once, the second output data signal DO12 of a 'm+1' number of bits and may sequentially output the first to (m+1)-th bits of the serialized data signal. The transmitter 226 may be connected to the serializer 225 and the second data transmission line 102-2 and may receive the serialized data from the serializer 225. Depending on the logic levels of the serialized data signal, the transmitter 226 may drive the second data transmission line 102-2 to transmit the second data stream DQ2<0:m>. The receiver 227 may be connected to the second data transmission line 102-2 and may receive the second data stream DQ2<0:m> transmitted through the second data transmission line 102-2. The parallelizer 228 may receive the second data stream DQ2<0:m> from the receiver 227. The parallelizer 228 may parallelize the second data stream DQ2<0:m> to generate the second input data signal DI12. For example, the parallelizer 228 may sequentially receive the first to (m+1)-th bits of the second data stream DQ2<0:m> and may output, all at once, the second input data signal DI12 of the 'm+1' number of bits.

Figure 3:
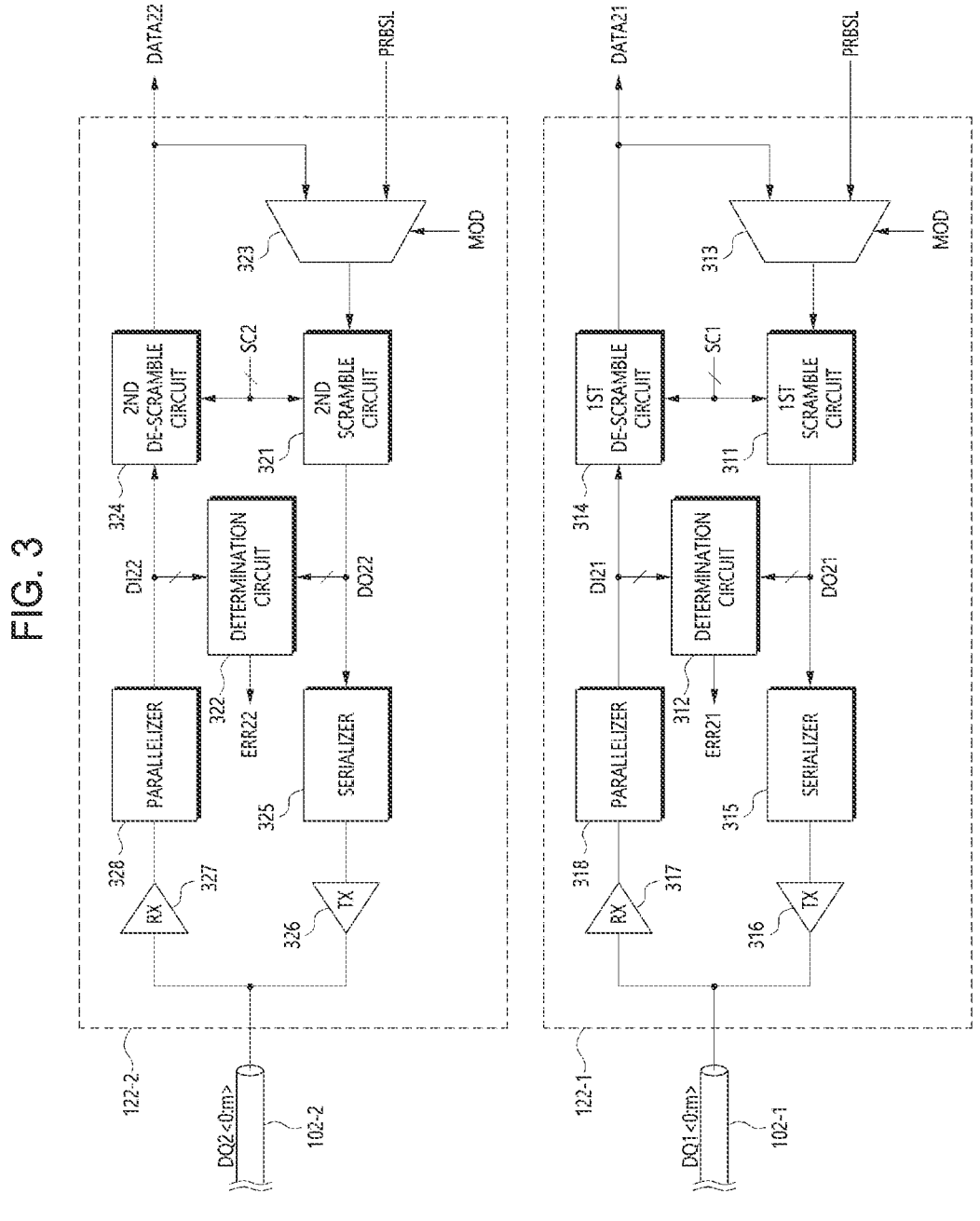
FIG. 3 is a diagram illustrating configurations of a first data input and output circuit and a second data input and output circuit in a second semiconductor apparatus illustrated in FIG. 1.

FIG. 3 is a diagram illustrating configurations of the first data input and output circuit 122-1 and the second data input and output circuit 122-2 in the second semiconductor apparatus 120 illustrated in FIG. 1. Referring to FIG. 3, the first data input and output circuit 122-1 may include a first scramble circuit 311. The first scramble circuit 311 may receive the first scramble code SC1, a partial data DATA21 of the normal data and the PRBS signal PRBSL. The partial data DATA21 of the normal data may be a partial data signal allocated from the normal data DATA2 to the first data input and output circuit 122-1. The first scramble circuit 311 may selectively receive one of the partial data DATA21 of the normal data and the PRBS signal PRBSL. During an operation other than the training operation, the first scramble circuit 311 may generate a first output data signal DO21 by scrambling the partial data DATA21 of the normal data based on the first scramble code SC1. The first output data signal DO21 generated during an operation other than the training operation may be read data. During the training operation, the first scramble circuit 311 may generate the first output data signal DO21 by scrambling the PRBS signal PRBSL based on the first scramble code SC1. The first output data signal DO21 generated during the training operation may be the training output data. The first scramble circuit 311 may have substantially the same structure as the first scramble circuit 211 (see FIG. 2) and may perform substantially the same function as the first scramble circuit 211. For an embodiment, the first output data signal DO21 generated from the first scramble circuit 311 may have substantially the same value as the first output data signal DO11 generated from the first scramble circuit 211. The first data input and output circuit 122-1 may generate the first data stream DQ1<0:m>, which is to be transmitted through the first data transmission line 102-1 (see FIG. 1), based on the first output data signal DO21. The first data input and output circuit 122-1 may transmit the first data stream DQ1<0:m> to the first semiconductor apparatus 110 through the first data transmission line 102-1. The first data input and output circuit 122-1 may receive the first data stream DQ1<0:m> transmitted through the first data transmission line 102-1 and may generate a first input data signal DI21 based on the first data stream DQ1<0:m>. The first input data signal DI21 generated during an operation other than the training operation may be write data. The first input data signal DI21 generated during the training operation may be the training input data. The first data input and output circuit 122-1 may perform a training operation by comparing the first output data signal DO21 with the first input data signal DI21.

The first data input and output circuit 122-1 may further include a determination circuit 312. The determination circuit 312 may receive the first output data signal DO21, which is from the first scramble circuit 311, and the first input data signal DI21, which is generated based on the first data stream DQ1<0:m>. The determination circuit 312 may compare the first output data signal DO21 with the first input data signal DI21. The determination circuit 312 may determine whether the first output data signal DO21 is the same as the first input data signal DI21. The determination circuit 312 may generate an error signal ERR21 by determining whether the first output data signal DO21 is the same as the first input data signal DI21. The determination circuit 312 might not generate the error signal ERR21 when the first output data signal DO21 is the same as the first input data signal DI21. The determination circuit 312 may generate the error signal ERR21 when the first output data signal DO21 is different from the first input data signal DI21. For instance, the determination circuit 312 may individually compare logic values between a bit within the first output data signal DO21 and a corresponding bit within the first input data signal DI21 and may count the number of bits having different logic values to generate the error signal ERR21.

The first data input and output circuit 122-1 may further include a selection circuit 313. The selection circuit 313 may receive a mode signal MOD, the partial data DATA21 of the normal data and the PRBS signal PRBSL. Based on the mode signal MOD, the selection circuit 313 may output one of the partial data DATA21 of the normal data and the PRBS signal PRBSL. The first scramble circuit 311 may scramble the output signal of the selection circuit 313 to generate the first output data signal DO21. For example, when the mode signal MOD is at a high logic level, the selection circuit 313 may output the PRBS signal PRBSL. When the mode signal MOD is at a low logic level, the selection circuit 313 may output the partial data DATA21 of the normal data. The mode signal MOD may have different logic levels according to a type of operation performed by the second semiconductor apparatus 120. When the second semiconductor apparatus 120 performs the training operation, the mode signal MOD may be set to a high logic level. When the second semiconductor apparatus 120 performs an operation other than the training operation, the mode signal MOD may be set to a low logic level. In an embodiment, the mode signal MOD may be generated from the command address control circuit 121.

The first data input and output circuit 122-1 may further include a first de-scramble circuit 314, a serializer 315, a transmitter 316, a receiver 317, and a parallelizer 318. The first de-scramble circuit 314 may receive the first scramble code SC1 and the first input data signal DI21. Based on the first scramble code SC1, the first de-scramble circuit 314 may de-scramble the first input data signal DI21 to generate the partial data DATA21 of the normal data. The first de-scramble circuit 314 may perform a function opposite to a function performed by the first scramble circuit 311. The serializer 315 may receive the first output data signal DO21. The serializer 315 may serialize the first output data signal DO21 to generate a serialized data signal. For instance, the serializer 315 may receive, all at once, the first output data signal DO21 of a 'm+1' number of bits and may sequentially output the first to (m+1)-th bits of the serialized data signal. The transmitter 316 may be connected to the serializer 315 and the first data transmission line 102-1 and may receive the serialized data from the serializer 315. Depending on the logic levels of the serialized data signal, the transmitter 316 may drive the first data transmission line 102-1 to transmit the first data stream DQ1<0:m>. The receiver 317 may be connected to the first data transmission line 102-1 and may receive the first data stream DQ1<0:m> transmitted through the first data transmission line 102-1. The parallelizer 318 may receive the first data stream DQ1<0:m> from the receiver 317. The parallelizer 318 may parallelize the first data stream DQ1<0:m> to generate the first input data signal DI21. For example, the parallelizer 318 may sequentially receive the first to (m+1)-th bits of the first data stream DQ1<0:m> and may output, all at once, the first input data signal DI21 of the 'm+1' number of bits.

The second data input and output circuit 122-2 may include substantially the same elements as the first data input and output circuit 122-1. The second data input and output circuit 122-2 may include a second scramble circuit 321, a determination circuit 322, a selection circuit 323, a second de-scramble circuit 324, a serializer 325, a transmitter 326, a receiver 327, and a parallelizer 328. The second scramble circuit 321 may receive the second scramble code SC2, another partial data DATA22 of the normal data and the PRBS signal PRBSL. The another partial data DATA22 of the normal data may be a partial data signal allocated from the normal data DATA2 to the second data input and output circuit 122-2. During an operation other than the training operation, the second scramble circuit 321 may generate a second output data signal DO22 by scrambling the another partial data DATA21 of the normal data based on the second scramble code SC2. The second output data signal DO22 generated during an operation other than the training operation may be the read data. During the training operation, the second scramble circuit 321 may generate the second output data signal DO22 by scrambling the PRBS signal PRBSL based on the second scramble code SC2. The second output data signal DO22 generated during the training operation may be the training output data. The second scramble circuit 321 may have substantially the same structure as the first scramble circuit 311 and may perform substantially the same function as the first scramble circuit 311. For an embodiment, the second output data signal DO22 generated from the second scramble circuit 321 may have substantially the same value as the second output data signal DO12 generated from the second scramble circuit 221 (see FIG. 2). The second data input and output circuit 122-2 may generate the second data stream DQ2<0:m>, which is to be transmitted through the second data transmission line 102-2 (see FIG. 1), based on the second output data signal DO22. The second data input and output circuit 122-2 may transmit the second data stream DQ2<0:m> to the first semiconductor apparatus 110 through the second data transmission line 102-2. The second data input and output circuit 122-2 may receive the second data stream DQ2<0:m> transmitted through the second data transmission line 102-2 and may generate a second input data signal DI22 based on the second data stream DQ2<0:m>. The second input data signal DI22 generated during an operation other than the training operation may be the write data. The second input data signal DI22 generated during the training operation may be the training input data.

The determination circuit 322 may receive the second output data signal DO22, which is from the second scramble circuit 321, and the second input data signal DI22, which is generated based on the second data stream DQ2<0:m>. The determination circuit 322 may compare the second output data signal DO22 with the second input data signal DI22. The determination circuit 322 may determine whether the second output data signal DO22 is the same as the second input data signal DI22. The determination circuit 322 may generate an error signal ERR22 by determining whether the second output data signal DO22 is the same as the second input data signal DI22. The determination circuit 322 might not generate the error signal ERR22 when the second output data signal DO22 is the same as the second input data signal DI22. The determination circuit 322 may generate the error signal ERR22 when the second output data signal DO22 is different from the second input data signal DI22. The selection circuit 323 may receive the mode signal MOD, the another partial data DATA22 of the normal data and the PRBS signal PRBSL. Based on the mode signal MOD, the selection circuit 323 may output one of the another partial data DATA22 of the normal data and the PRBS signal PRBSL. The second scramble circuit 321 may scramble the output signal of the selection circuit 323 to generate the second output data signal DO22. For example, when the mode signal MOD is at a high logic level, the selection circuit 323 may output the PRBS signal PRBSL. When the mode signal MOD is at a low logic level, the selection circuit 323 may output the another partial data DATA22 of the normal data.

The second de-scramble circuit 324 may receive the second scramble code SC2 and the second input data signal DI22. Based on the second scramble code SC2, the second de-scramble circuit 324 may de-scramble the second input data signal DI22 to generate the another partial data DATA22 of the normal data. The second de-scramble circuit 324 may perform a function opposite to a function performed by the second scramble circuit 321. The serializer 325 may receive the second output data signal DO22. The serializer 325 may serialize the second output data signal DO22 to generate a serialized data signal. For instance, the serializer 325 may receive, all at once, the second output data signal DO22 of a 'm+1' number of bits and may sequentially output the first to (m+1)-th bits of the serialized data signal. The transmitter 326 may be connected to the serializer 325 and the second data transmission line 102-2 and may receive the serialized data from the serializer 325. Depending on the logic levels of the serialized data signal, the transmitter 326 may drive the second data transmission line 102-2 to transmit the second data stream DQ2<0:m>. The receiver 327 may be connected to the second data transmission line 102-2 and may receive the second data stream DQ2<0:m> transmitted through the second data transmission line 102-2. The parallelizer 328 may receive the second data stream DQ2<0:m> from the receiver 327. The parallelizer 328 may parallelize the second data stream DQ2<0:m> to generate the second input data signal DI22. For example, the parallelizer 328 may sequentially receive the first to (m+1)-th bits of the second data stream DQ2<0: m> and may output, all at once, the second input data signal DI22 of the 'm+1' number of bits.

Figure 4A:
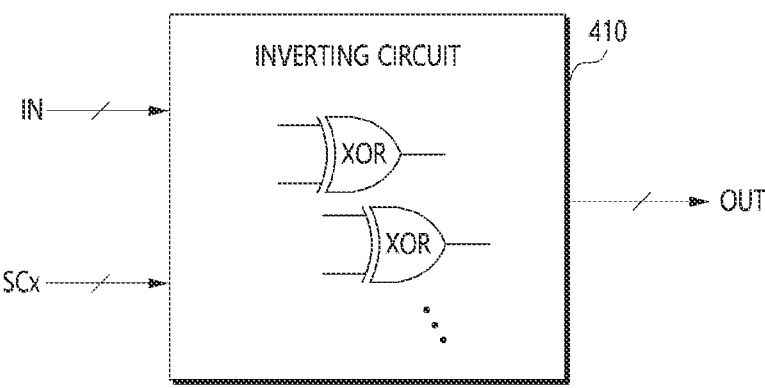
FIGS. 4A to 4C are diagrams illustrating configurations of scramblers in accordance with some embodiments.
Figure 4B:
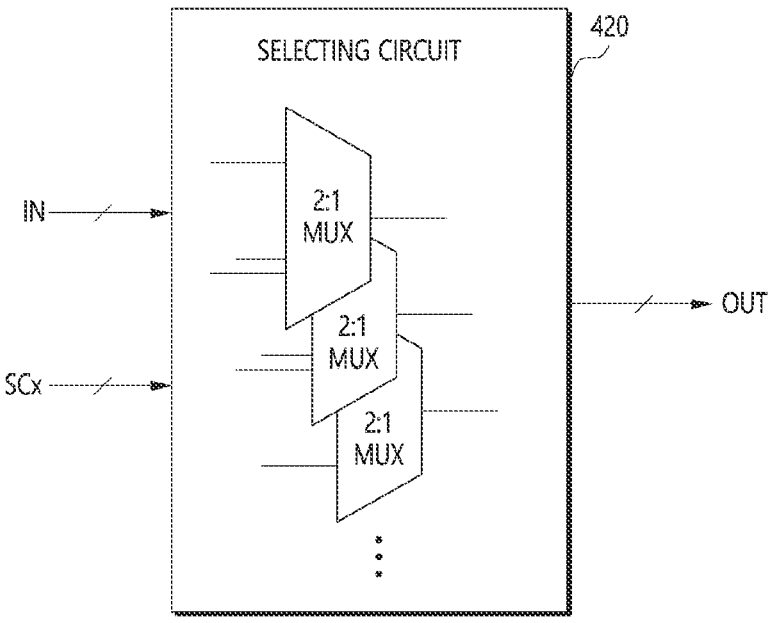
Figure 4C:
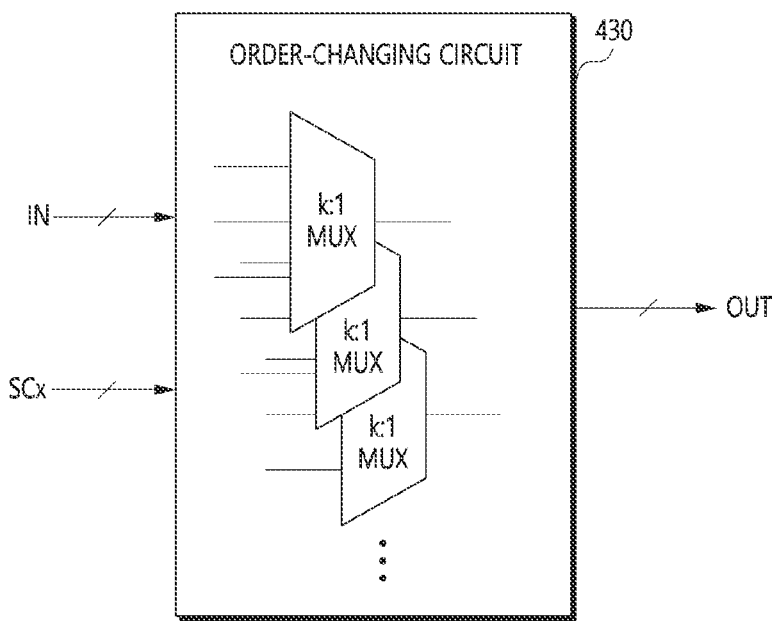

FIGS. 4A to 4C are diagrams illustrating configurations of scramblers 410, 420, and 430 in accordance with some embodiments. Referring to FIG. 4A, the scrambler 410 may perform a function of an inverting circuit to scramble an input signal IN. The scrambler 410 may receive the input signal IN and a scramble code SCx to generate an output signal OUT. Based on the scramble code SCx, the scrambler 410 may invert the logic level of at least one among bits of the input signal IN to generate the output signal OUT. For instance, the scrambler 410 may include a plurality of XOR gates XOR each configured to receive a corresponding bit from the input signal IN and a corresponding bit from the scramble code SCx. Each of the first scramble circuits 211, 221, 311, and 321 illustrated in FIGS. 2 and 3 may include the scrambler 410. Referring FIG. 4B, the scrambler 420 may perform a function of a selection circuit to scramble the input signal IN. The scrambler 420 may receive the input signal IN and the scramble code SCx to generate the output signal OUT. Based on the scramble code SCx, the scrambler 420 may select particular bits from the input signal IN and output the selected bits as the bits of the output signal OUT. For instance, the scrambler 420 may include a plurality of multiplexers 2:1 MUX each configured to receive, as a control signal, a corresponding bit from the scramble code SCx and each configured to receive at least two (2) bits from the input signal IN. Each of the first scramble circuits 211, 221, 311, and 321 illustrated in FIGS. 2 and 3 may include the scrambler 420. Referring to FIG. 4C, the scrambler 430 may perform a function of an order-changing circuit to scramble the input signal IN. The scrambler 430 may receive the input signal IN and the scramble code SCx to generate the output signal OUT. Based on the scramble code SCx, the scrambler 430 may change the order of the bits of the input signal IN to generate the output signal OUT having the changed logic values. For example, the scrambler 430 may include a plurality of multiplexers k:1 MUX (k is an integer of 3 or greater) each configured to receive, as a control signal, at least one (1) bit from the scramble code SCx and each configured to receive at least three (3) bits from the input signal IN. Each of the first scramble circuits 211, 221, 311, and 321 illustrated in FIGS. 2 and 3 may include the scrambler 430.

Figure 5A:
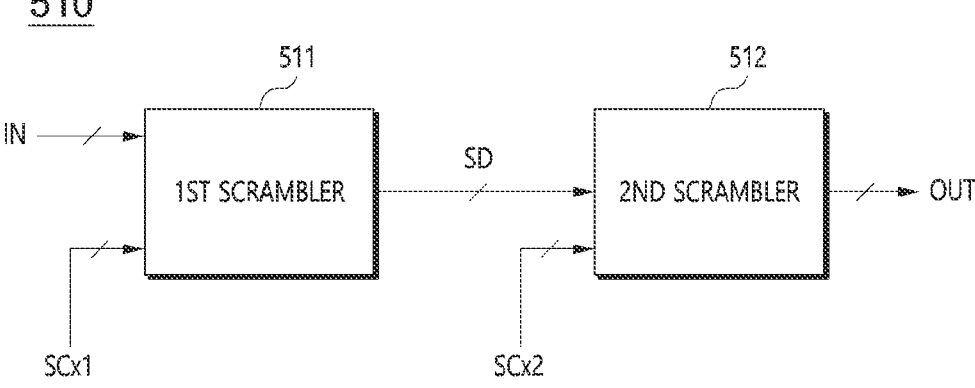
FIGS. 5A to 5C are diagrams illustrating configurations of scramble circuits in accordance with some embodiments.
Figure 5B:
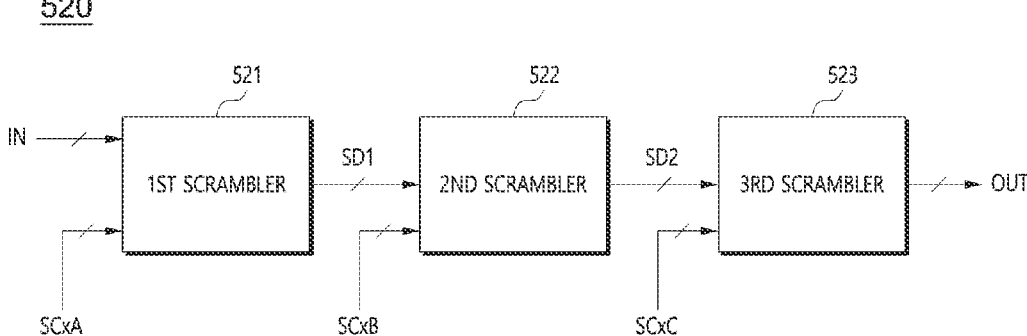
Figure 5C:
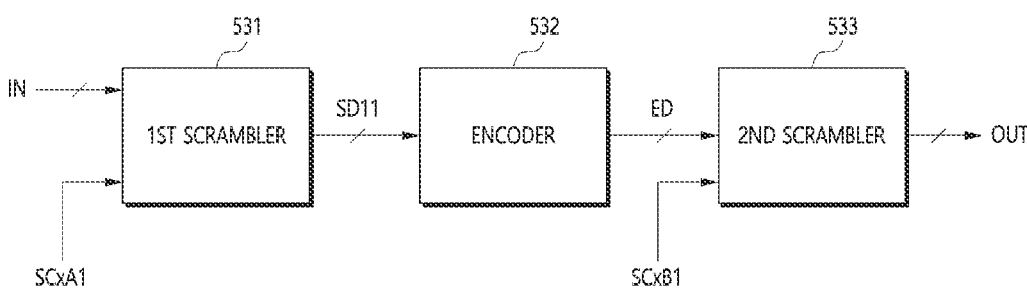

FIGS. 5A to 5C are diagrams illustrating configurations of scramble circuits 510, 520, and 530 in accordance with some embodiments. One of the scramble circuits 510, 520, and 530 illustrated in FIGS. 5A to 5C may be applied as each of the first scramble circuits 211, 221, 311, and 321 illustrated in FIGS. 2 and 3. Referring to FIG. 5A, the scramble circuit 510 may include a first scrambler 511 and a second scrambler 512. The first scrambler 511 may receive an input signal IN and at least a partial code SCx1 of the scramble code SCx. Based on the partial code SCx1 of the scramble code SCx, the first scrambler 511 may scramble the input signal IN to generate a scrambled signal SD. The second scrambler 512 may receive the scrambled signal SD and at least a partial code SCx2 of the scramble code SCx. The partial code SCx2 of the scramble code SCx provided to the second scrambler 512 may be the same as or different from, at least partially, the partial code SCx1 of the scramble code SCx provided to the first scrambler 511. Based on the partial code SCx2 of the scramble code SCx, the second scrambler 512 may scramble the scrambled signal SD generated from the first scrambler 511 to generate the output signal OUT. One of the scramblers 410, 420, and 430 illustrated in FIGS. 4A to 4C may be applied as the first scrambler 511 and another one of the scramblers 410, 420, and 430 may be applied as the second scrambler 512.

Referring to FIG. 5B, the scramble circuit 520 may include a first scrambler 521, a second scrambler 522, and a third scrambler 523. The first scrambler 521 may receive an input signal IN and at least a partial code SCxA of the scramble code SCx. Based on the partial code SCxA of the scramble code SCx, the first scrambler 521 may scramble the input signal IN to generate a first scrambled signal SD1. The second scrambler 522 may receive the first scrambled signal SD1 and at least a partial code SCxB of the scramble code SCx. The partial code SCxB of the scramble code SCx provided to the second scrambler 522 may be the same as or different from, at least partially, the partial code SCxA of the scramble code SCx provided to the first scrambler 521. Based on the partial code SCxB of the scramble code SCx, the second scrambler 522 may scramble the first scrambled signal SD1 to generate a second scrambled signal SD2. The third scrambler 523 may receive the second scrambled signal SD2 and at least a partial code SCxC of the scramble code SCx. The partial code SCxC of the scramble code SCx provided to the third scrambler 523 may be the same as or different from, at least partially, the partial codes SCxA and SCxB of the scramble code SCx provided respectively to the first scrambler 521 and the second scrambler 522. Based on the partial code SCxC of the scramble code SCx, the third scrambler 523 may scramble the second scrambled signal SD2 to generate the output signal OUT. One of the scramblers 410, 420, and 430 illustrated in FIGS. 4A to 4C may be applied as the first scrambler 521, another one of the scramblers 410, 420, and 430 may be applied as the second scrambler 522 and the remaining one of the scramblers 410, 420, and 430 may be applied as the third scrambler 523.

Referring to FIG. 5C, the scramble circuit 530 may include a first scrambler 531, an encoder 532, and a second scrambler 533. The first scrambler 531 may receive an input signal IN and at least a partial code SCxA1 of the scramble code SCx. Based on the partial code SCxA1 of the scramble code SCx, the first scrambler 531 may scramble the input signal IN to generate a scrambled signal SD11. The encoder 532 may receive the scrambled signal SD11 from the first scrambler 531. The encoder 532 may encode the scrambled signal SD11 to generate an encoded signal ED. According to a preset scheme, the encoder 532 may encode the scrambled signal SD11 to generate the encoded signal ED. The second scrambler 533 may receive the encoded signal ED and at least a partial code SCxB1 of the scramble code SCx. The partial code SCxB1 of the scramble code SCx provided to the second scrambler 533 may be the same as or different from, at least partially, the partial code SCxA1 of the scramble code SCx provided to the first scrambler 531. Based on the partial code SCxB1 of the scramble code SCx, the second scrambler 533 may scramble the encoded signal ED to generate the output signal OUT. One of the scramblers 410, 420, and 430 illustrated in FIGS. 4A to 4C may be applied as the first scrambler 531 and another one of the scramblers 410, 420, and 430 may be applied as the second scrambler 533.

Figure 6:
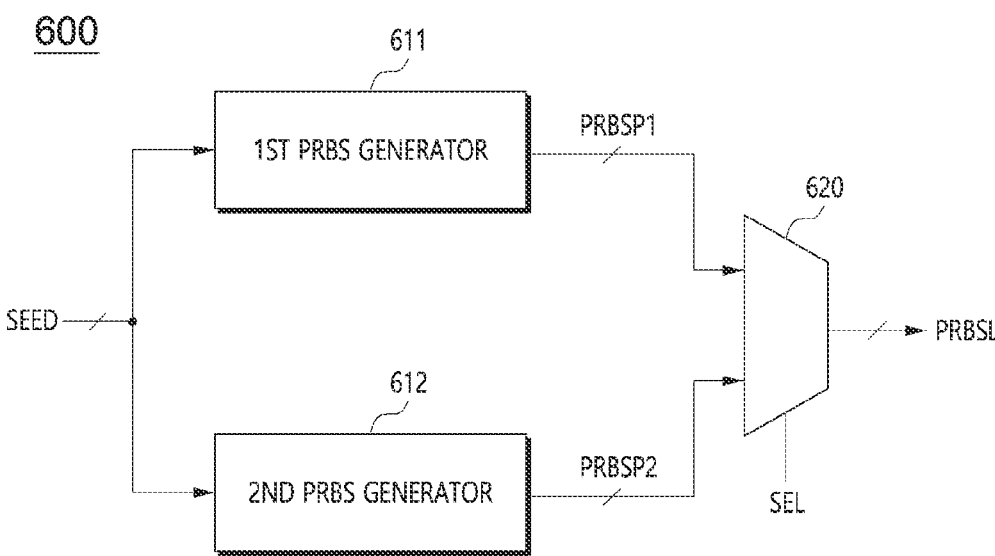
FIG. 6 is a diagram illustrating a configuration of a PRBS generation circuit in accordance with an embodiment.

FIG. 6 is a diagram illustrating a configuration of a PRBS generation circuit 600 in accordance with an embodiment. The PRBS generation circuit 600 may be applied as each of the PRBS generation circuits 113 and 123 illustrated in FIG. 1. Referring to FIG. 6, the PRBS generation circuit 600 may receive a seed signal SEED to generate the PRBS signal PRBSL. The PRBS generation circuit 600 may include a first PRBS generator 611, a second PRBS generator 612, and a selection circuit 620. Both the first PRBS generator 611 and the second PRBS generator 612 may commonly receive the seed signal SEED. The seed signal SEED may be a signal having arbitrary logic values to generate various PRBS patterns. The seed signal SEED may be generated by the command address generation circuit 111 and the command address control circuit 121 illustrated in FIG. 1. The first PRBS generator 611 may generate a first PRBS pattern PRBSP1 based on the seed signal SEED. The second PRBS generator 612 may generate a second PRBS pattern PRBSP2 based on the seed signal SEED. The first PRBS generator 611 and the second PRBS generator 612 may be implemented by different types of PRBS pattern generators configured to respectively generate different patterns. The selection circuit 620 may receive the first PRBS pattern PRBSP1, the second PRBS pattern PRBSP2, and a selection signal SEL. According to the selection signal SEL, the selection circuit 620 may output, as the PRBS signal PRBSL, one of the first PRBS pattern PRBSP1 and the second PRBS pattern PRBSP2. For instance, when the selection signal SEL is in a high logic state, the selection circuit 620 may output the first PRBS pattern PRBSP1 as the PRBS signal PRBSL. When the selection signal SEL is in a low logic state, the selection circuit 620 may output the second PRBS pattern PRBSP2 as the PRBS signal PRBSL.

FIGS. 7A and 7B are flowcharts illustrating an operation of a semiconductor system 100 in accordance with an embodiment. Hereinafter, described with reference to FIGS. 1 to 3, 7A, and 7B will be the operation of the semiconductor system 100 in accordance with an embodiment. FIG. 7A is a flowchart illustrating the read training operation of the semiconductor system 100 in accordance with an embodiment. At S71a, the first semiconductor apparatus 110 may generate a plurality of scramble codes and may assign the plurality of scramble codes respectively to a plurality of data input and output circuits, to perform the read training operation. The command address generation circuit 111 may generate the first to n-th scramble codes SC1 to SCn based on the command address signal CA and may assign the first to n-th scramble codes SC1 to SCn respectively to the first to n-th data input and output circuits 112-1 to 112-n. The command address generation circuit 111 may transmit the command address signal CA to the second semiconductor apparatus 120 through the command address bus 101. The command address control circuit 121 may generate the first to n-th scramble codes SC1 to SCn based on the command address signal CA and may assign the first to n-th scramble codes SC1 to SCn respectively to the first to n-th data input and output circuits 122-1 to 122-n. At S72a, the read training operation may be performed. The command address generation circuit 111 may generate, based on the request REQ, the command address signal CA for the read training operation and may transmit the command address signal CA to the second semiconductor apparatus 120. Both the first semiconductor apparatus 110 and the second semiconductor apparatus 120 may start performing the read training operation based on the command address signal CA. At S73a, the first semiconductor apparatus 110 may scramble the PRBS signal PRBSL individually based on the assigned scramble codes SC1 to SCn to generate the training output data. The first to n-th data input and output circuits 112-1 to 112-n of the first semiconductor apparatus 110 may commonly receive the PRBS signal PRBSL and may scramble, based on the scramble codes SC1 to SCn respectively assigned thereto, the PRBS signal PRBSL in different ways from each other to generate the training output data. For instance, the first data input and output circuit 112-1 may scramble the PRBS signal PRBSL based on the first scramble code SC1 to generate the first output data signal DO11. The second data input and output circuit 112-2 may scramble the PRBS signal PRBSL based on the second scramble code SC2 to generate the second output data signal DO12. The n-th data input and output circuit 112-n may scramble the PRBS signal PRBSL based on the n-th scramble code SCn to generate the n-th output data signal.

At S74a, the second semiconductor apparatus 120 may scramble the PRBS signal PRBSL individually based on the assigned scramble codes SC1 to SCn to generate the training output data. The first to n-th data input and output circuits 122-1 to 122-n of the second semiconductor apparatus 120 may commonly receive the PRBS signal PRBSL and may scramble, based on the scramble codes SC1 to SCn respectively assigned thereto, the PRBS signal PRBSL in different ways from each other to generate the training output data. For instance, the first data input and output circuit 122-1 may scramble the PRBS signal PRBSL based on the first scramble code SC1 to generate the first output data signal DO21. The second data input and output circuit 122-2 may scramble the PRBS signal PRBSL based on the second scramble code SC2 to generate the second output data signal DO22. The n-th data input and output circuit 122-n may scramble the PRBS signal PRBSL based on the n-th scramble code SCn to generate the n-th output data signal. At S75a, the second semiconductor apparatus 120 may generate, based on the training output data, data streams and may transmit the data streams to the first semiconductor apparatus 110. The first to n-th data input and output circuits 122-1 to 122-n may generate the first to n-th data streams DQ1 to DQn based on the first to n-th output data signals and may transmit the first to n-th data streams DQ1 to DQn to the first semiconductor apparatus 110, respectively. For example, the first data input and output circuit 122-1 may generate the first data stream DQ1 based on the first output data signal DO21 and may transmit the first data stream DQ1 to the first semiconductor apparatus 110 through the first data transmission line 102-1. The second data input and output circuit 122-2 may generate the second data stream DQ2 based on the second output data signal DO22 and may transmit the second data stream DQ2 to the first semiconductor apparatus 110 through the second data transmission line 102-2. The n-th data input and output circuit 122-n may generate the n-th data stream DQn based on the n-th output data signal and may transmit the n-th data stream DQn to the first semiconductor apparatus 110 through the n-th data transmission line 102-n.

At S76a, the first semiconductor apparatus 110 may receive the first to n-th data streams DQ1 to DQn and may generate the training input data based on the first to n-th data streams DQ1 to DQn. The first to n-th data input and output circuits 112-1 to 112-n may receive the data streams DQ1 to DQn and may generate the first to n-th input data signals based on the data streams DQ1 to DQn, respectively. For example, the first data input and output circuit 112-1 may receive the first data stream DQ1 through the first data transmission line 102-1 and may generate the first input data signal DI11 based on the first data stream DQ1. The second data input and output circuit 112-2 may receive the second data stream DQ2 through the second data transmission line 102-2 and may generate the second input data signal DI12 based on the second data stream DQ2. The n-th data input and output circuit 112-n may receive the n-th data stream DQn through the n-th data transmission line 102-n and may generate the n-th input data signal based on the n-th data stream DQn.

At S77a, the first semiconductor apparatus 110 may compare the training output data with the training input data. The first to n-th data input and output circuits 112-1 to 112-n may compare the training output data with the training input data. The first to n-th data input and output circuits 112-1 to 112-n may compare the first to n-th output data signals with the first to n-th input data signals, respectively. For example, the first data input and output circuit 112-1 may determine whether the first output data signal DO11 generated from the first data input and output circuit 112-1 is the same as the first input data signal DI11 generated based on the first data stream DQ1. The first data input and output circuit 112-1 may compare the logic values between corresponding bits of the first output data signal DO11 and the first input data signal DI11. Whenever the logic values are different from each other between the corresponding bits, the first data input and output circuit 112-1 may perform the counting operation to generate the error signal ERR11. The error signal ERR11 may correspond to a result of the reliability verification between the data input path (i.e., the receiver 217 and the parallelizer 218 in FIG. 2) of the first data input and output circuit 112-1 in the first semiconductor apparatus 110 and the data output path (i.e., the serializer 315 and the transmitter 316 in FIG. 3) of the first data input and output circuit 122-1 in the second semiconductor apparatus 120. The second data input and output circuit 112-2 may determine whether the second output data signal DO12 generated from the second data input and output circuit 112-2 is the same as the second input data signal DI12 generated based on the second data stream DQ2. The second data input and output circuit 112-2 may compare the logic values between corresponding bits of the second output data signal DO12 and the second input data signal DI12. Whenever the logic values are different from each other between the corresponding bits, the second data input and output circuit 112-2 may perform the counting operation to generate the error signal ERR12. The error signal ERR12 may correspond to a result of the reliability verification between the data input path (i.e., the receiver 227 and the parallelizer 228 in FIG. 2) of the second data input and output circuit 112-2 in the first semiconductor apparatus 110 and the data output path (i.e., the serializer 325 and the transmitter 326 in FIG. 3) of the second data input and output circuit 122-2 in the second semiconductor apparatus 120. The n-th data input and output circuit 112-n may determine whether the n-th output data signal generated from the n-th data input and output circuit 112-n is the same as the n-th input data signal generated based on the n-th data stream DQn. The n-th data input and output circuit 112-n may compare the logic values between corresponding bits of the n-th output data signal and the n-th input data signal. Whenever the logic values are different from each other between the corresponding bits, the n-th data input and output circuit 112-n may perform the counting operation to generate the error signal. The error signal may correspond to a result of the reliability verification between the data input path of the n-th data input and output circuit 112-n in the first semiconductor apparatus 110 and the data output path of the n-th data input and output circuit 122-n in the second semiconductor apparatus 120.

FIG. 7B is a flowchart illustrating the write training operation of the semiconductor system 100 in accordance with an embodiment. At S71b, the first semiconductor apparatus 110 may generate a plurality of scramble codes and may assign the plurality of scramble codes respectively to a plurality of data input and output circuits, to perform the write training operation. The command address generation circuit 111 may generate the first to n-th scramble codes SC1 to SCn based on the command address signal CA and may assign the first to n-th scramble codes SC1 to SCn respectively to the first to n-th data input and output circuits 112-1 to 112-n. The command address generation circuit 111 may transmit the command address signal CA to the second semiconductor apparatus 120 through the command address bus 101. The command address control circuit 121 may generate the first to n-th scramble codes SC1 to SCn based on the command address signal CA and may assign the first to n-th scramble codes SC1 to SCn respectively to the first to n-th data input and output circuits 122-1 to 122-n. At S72b, the write training operation may be performed. The command address generation circuit 111 may generate, based on the request REQ, the command address signal CA for the write training operation and may transmit the command address signal CA to the second semiconductor apparatus 120. Both the first semiconductor apparatus 110 and the second semiconductor apparatus 120 may start performing the write training operation based on the command address signal CA. At S73b, the first semiconductor apparatus 110 may scramble the PRBS signal PRBSL individually based on the assigned scramble codes SC1 to SCn to generate the training output data. The first to n-th data input and output circuits 112-1 to 112-n of the first semiconductor apparatus 110 may commonly receive the PRBS signal PRBSL and may scramble, based on the scramble codes SC1 to SCn respectively assigned thereto, the PRBS signal PRBSL in different ways from each other to generate the training output data. For instance, the first data input and output circuit 112-1 may scramble the PRBS signal PRBSL based on the first scramble code SC1 to generate the first output data signal DO11. The second data input and output circuit 112-2 may scramble the PRBS signal PRBSL based on the second scramble code SC2 to generate the second output data signal DO12. The n-th data input and output circuit 112-n may scramble the PRBS signal PRBSL based on the n-th scramble code SCn to generate the n-th output data signal. At S74b, the first semiconductor apparatus 110 may generate, based on the training output data, data streams and may transmit the data streams to the second semiconductor apparatus 120. The first to n-th data input and output circuits 112-1 to 112-n may generate the first to n-th data streams DQ1 to DQn based on the first to n-th output data signals and may transmit the first to n-th data streams DQ1 to DQn to the second semiconductor apparatus 120, respectively. For example, the first data input and output circuit 112-1 may generate the first data stream DQ1 based on the first output data signal DO11 and may transmit the first data stream DQ1 to the second semiconductor apparatus 120 through the first data transmission line 102-1. The second data input and output circuit 112-2 may generate the second data stream DQ2 based on the second output data signal DO12 and may transmit the second data stream DQ2 to the second semiconductor apparatus 120 through the second data transmission line 102-2. The n-th data input and output circuit 112-n may generate the n-th data stream DQn based on the n-th output data signal and may transmit the n-th data stream DQn to the second semiconductor apparatus 120 through the n-th data transmission line 102-n.

At S75b, the second semiconductor apparatus 120 may scramble the PRBS signal PRBSL individually based on the assigned scramble codes SC1 to SCn to generate the training output data. The first to n-th data input and output circuits 122-1 to 122-n of the second semiconductor apparatus 120 may commonly receive the PRBS signal PRBSL and may scramble, based on the scramble codes SC1 to SCn respectively assigned thereto, the PRBS signal PRBSL in different ways from each other to generate the training output data. For instance, the first data input and output circuit 122-1 may scramble the PRBS signal PRBSL based on the first scramble code SC1 to generate the first output data signal DO21. The second data input and output circuit 122-2 may scramble the PRBS signal PRBSL based on the second scramble code SC2 to generate the second output data signal DO22. The n-th data input and output circuit 122-n may scramble the PRBS signal PRBSL based on the n-th scramble code SCn to generate the n-th output data signal. At S76b, the second semiconductor apparatus 120 may receive the first to n-th data streams DQ1 to DQn and may generate the training input data based on the first to n-th data streams DQ1 to DQn. The first to n-th data input and output circuits 122-1 to 122-n may receive the data streams DQ1 to DQn and may generate the first to n-th input data signals based on the data streams DQ1 to DQn, respectively. For example, the first data input and output circuit 122-1 may receive the first data stream DQ1 through the first data transmission line 102-1 and may generate the first input data signal DI21 based on the first data stream DQ1. The second data input and output circuit 122-2 may receive the second data stream DQ2 through the second data transmission line 102-2 and may generate the second input data signal DI22 based on the second data stream DQ2. The n-th data input and output circuit 122-n may receive the n-th data stream DQn through the n-th data transmission line 102-n and may generate the n-th input data signal based on the n-th data stream DQn.

At S77b, the second semiconductor apparatus 120 may compare the training output data with the training input data signal. The first to n-th data input and output circuits 122-1 to 122-n may compare the training output data with the training input data. The first to n-th data input and output circuits 122-1 to 122-n may compare the first to n-th output data signals with the first to n-th input data signals, respectively. For example, the first data input and output circuit 122-1 may determine whether the first output data signal DO21 generated from the first data input and output circuit 122-1 is the same as the first input data signal DI21 generated based on the first data stream DQ1. The first data input and output circuit 122-1 may compare the logic values between corresponding bits of the first output data signal DO21 and the first input data signal DI21. Whenever the logic values are different from each other between the corresponding bits, the first data input and output circuit 122-1 may perform the counting operation to generate the error signal ERR21. The error signal ERR21 may correspond to a result of the reliability verification between the data output path (i.e., the serializer 215 and the transmitter 216 in FIG. 2) of the first data input and output circuit 112-1 in the first semiconductor apparatus 110 and the data input path (i.e., the receiver 317 and the parallelizer 318 in FIG. 3) of the first data input and output circuit 122-1 in the second semiconductor apparatus 120. The second data input and output circuit 122-2 may determine whether the second output data signal DO22 generated from the second data input and output circuit 122-2 is the same as the second input data signal DI22 generated based on the second data stream DQ2. The second data input and output circuit 122-2 may compare the logic values between corresponding bits of the second output data signal DO22 and the second input data signal DI22. Whenever the logic values are different from each other between the corresponding bits, the second data input and output circuit 122-2 may perform the counting operation to generate the error signal ERR22. The error signal ERR22 may correspond to a result of the reliability verification between the data output path (i.e., the serializer 225 and the transmitter 226 in FIG. 2) of the second data input and output circuit 112-2 in the first semiconductor apparatus 110 and the data input path (i.e., the receiver 327 and the parallelizer 328 in FIG. 3) of the second data input and output circuit 122-2 in the second semiconductor apparatus 120. The n-th data input and output circuit 122-n may determine whether the n-th output data signal generated from the n-th data input and output circuit 122-n is the same as the n-th input data signal generated based on the n-th data stream DQn. The n-th data input and output circuit 122-n may compare the logic values between corresponding bits of the n-th output data signal and the n-th input data signal. Whenever the logic values are different from each other between the corresponding bits, the n-th data input and output circuit 122-n may perform the counting operation to generate the error signal. The error signal may correspond to a result of the reliability verification between the data output path of the n-th data input and output circuit 112-n in the first semiconductor apparatus 110 and the data input path of the n-th data input and output circuit 122-n in the second semiconductor apparatus 120.

Figure 8:
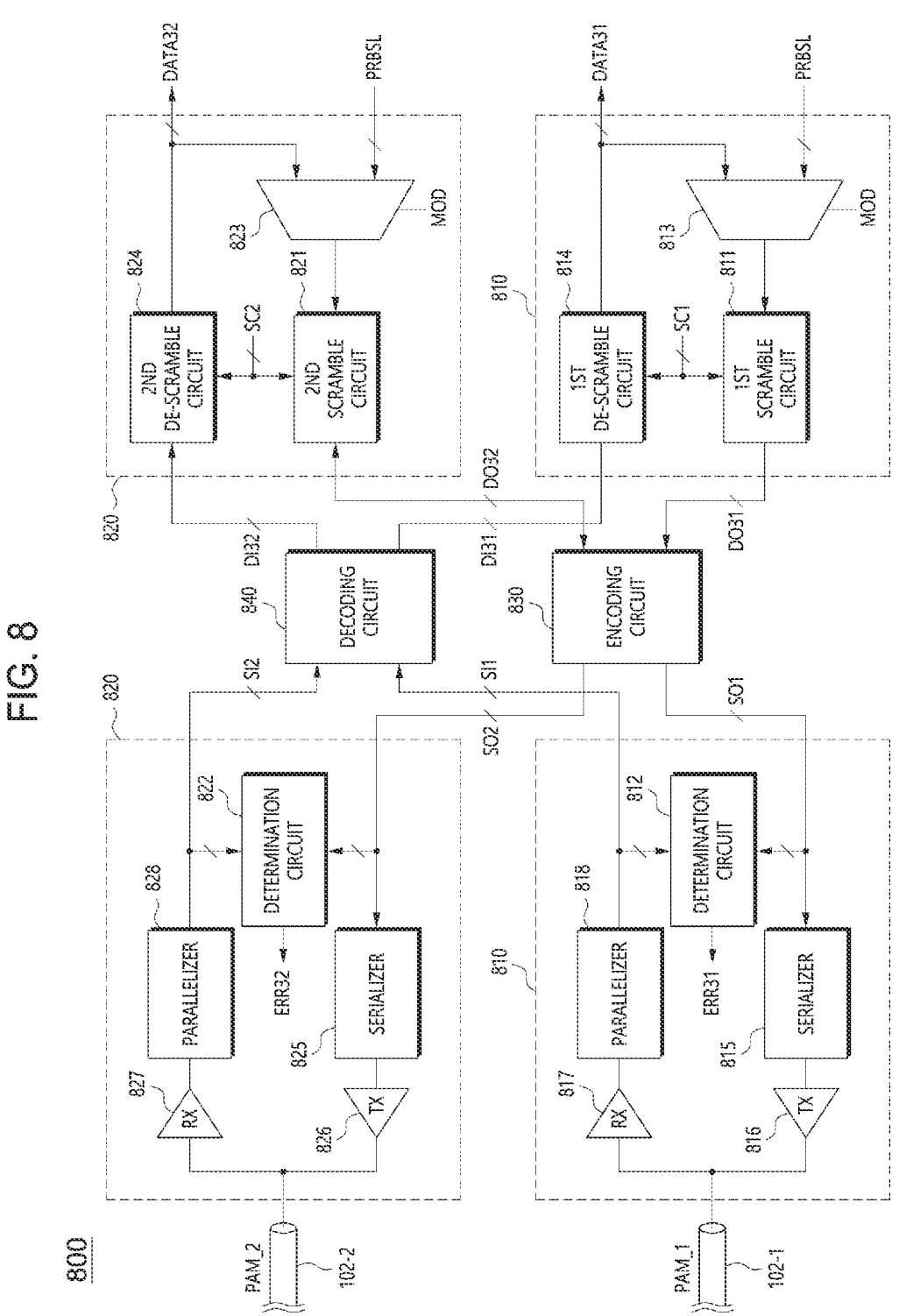
FIG. 8 is a diagram illustrating a partial configuration of a semiconductor apparatus in accordance with an embodiment.

FIG. 8 is a diagram illustrating a partial configuration of a semiconductor apparatus 800 in accordance with an embodiment. The semiconductor apparatus 800 may be applied as each of the first semiconductor apparatus 110 and the second semiconductor apparatus 120 illustrated in FIG. 1. Referring to FIG. 8, the semiconductor apparatus 800 may include a first data input and output circuit 810, a second data input and output circuit 820, an encoding circuit 830, and a decoding circuit 840. The first data input and output circuit 810 may include substantially the same elements as the first data input and output circuit 112-1 or 122-1 shown in FIG. 2 or 3. The first data input and output circuit 810 may include a first scramble circuit 811, a determination circuit 812, a selection circuit 813, a first de-scramble circuit 814, a serializer 815, a transmitter 816, a receiver 817, and a parallelizer 818. The second data input and output circuit 820 may include substantially the same elements as the second data input and output circuit 112-2 or 122-2 shown in FIG. 2 or 3. The second data input and output circuit 820 may include a second scramble circuit 821, a determination circuit 822, a selection circuit 823, a second de-scramble circuit 824, a serializer 825, a transmitter 826, a receiver 827, and a parallelizer 828. Referring to FIGS. 2, 3, and 8, similar numerals may indicate the same elements. Hereinafter, redundant descriptions about the same elements will be omitted. When the semiconductor apparatus 800 is applied as the first semiconductor apparatus 110, partial data DATA31 of normal data and another partial data DATA32 of the normal data may respectively correspond to the partial data DATA11 of the normal data and the another partial data DATA12 of the normal data. Further, a first output data signal DO31, a first input data signal DI31, a second output data signal DO32, and a second input data signal DI32 may respectively correspond to the first output data signal DO11, the first input data signal DI11, the second output data signal DO12, and the second input data signal DI12. When the semiconductor apparatus 800 is applied as the second semiconductor apparatus 120, the partial data DATA31 of the normal data and the another partial data DATA32 of the normal data may respectively correspond to the partial data DATA21 of the normal data and the another partial data DATA22 of the normal data. Further, the first output data signal DO31, the first input data signal DI31, the second output data signal DO32, and the second input data signal DI32 may respectively correspond to the first output data signal DO21, the first input data signal DI21, the second output data signal DO22, and the second input data signal DI22.

The encoding circuit 830 may receive the first output data signal DO31 from the first scramble circuit 811 and the second output data signal DO32 from the second scramble circuit 821. The encoding circuit 830 may encode the first output data signal DO31 and the second output data signal DO32 to generate a first output symbol SO1 and a second output symbol SO2, respectively. The encoding circuit 830 may encode the first output data signal DO31 and the second output data signal DO32 according to various encoding schemes. The encoding circuit 830 may generate the first output symbol SO1 and the second output symbol SO2, which can be converted into the PAM signals, to output the first output data signal DO31 and the second output data signal DO32 as the PAM signals. The serializer 815 may receive the first output symbol SO1 and may serialize the first output symbol SO1 to generate a serialized symbol. The transmitter 816 may drive, based on the serialized symbol, the first data transmission line 102-1 to transmit the first PAM signal PAM_1. The transmitter 816 may include a digital-to-analog converter configured to convert the first symbol SO1 into the first PAM signal PAM_1. The serializer 825 may receive the second output symbol SO2 and may serialize the second output symbol SO2 to generate a serialized symbol. The transmitter 826 may drive, based on the serialized symbol, the second data transmission line 102-2 to transmit the second PAM signal PAM_2. The transmitter 826 may include a digital-to-analog converter configured to convert the second symbol SO2 into the second PAM signal PAM_2.

The receiver 817 may receive the first PAM signal PAM_1 through the first data transmission line 102-1. The receiver 817 may generate, from the first PAM signal PAM_1, a symbol corresponding to the first PAM signal PAM_1. The receiver 817 may include an analog-to-digital converter configured to convert the first PAM signal PAM_1 into the symbol. The parallelizer 818 may receive the symbol generated from the receiver 817. The parallelizer 818 may parallelize the symbol corresponding to the first PAM signal PAM_1 to generate a first input symbol SI1. The receiver 827 may receive the second PAM signal PAM_2 through the second data transmission line 102-2. The receiver 827 may generate, from the second PAM signal PAM_2, a symbol corresponding to the second PAM signal PAM_2. The receiver 827 may include an analog-to-digital converter configured to convert the second PAM signal PAM_2 into the symbol. The parallelizer 828 may receive the symbol generated from the receiver 827. The parallelizer 828 may parallelize the symbol corresponding to the second PAM signal PAM_2 to generate a second input symbol SI2.

The decoding circuit 840 may receive the first input symbol SI1 from the parallelizer 818 and the second input symbol SI2 from the parallelizer 828. The decoding circuit 840 may decode the first input symbol SI1 and the second input symbol SI2 to generate the first input data signal DI31 and the second input data signal DI32, respectively. The first de-scramble circuit 814 may receive the first input data signal DI31 from the decoding circuit 840. The second de-scramble circuit 824 may receive the second input data signal DI32 from the decoding circuit 840.

The determination circuit 812 may receive the first output symbol SO1 generated from the encoding circuit 830 and the first input symbol SI1 generated from the parallelizer 818. The determination circuit 812 may compare the first output symbol SO1 with the first input symbol SI1 to perform a training operation. The determination circuit 812 may generate an error signal ERR31 by determining whether the first output symbol SO1 is the same as the first input symbol SI1. When the first output symbol SO1 and the first input symbol SI1 are substantially the same as each other, the determination circuit 812 might not generate the error signal ERR31. When the first output symbol SO1 and the first input symbol SI1 are different from each other, the determination circuit 812 may generate the error signal ERR31. The determination circuit 822 may receive the second output symbol SO2 generated from the encoding circuit 830 and the second input symbol SI2 generated from the parallelizer 828. The determination circuit 822 may compare the second output symbol SO2 with the second input symbol SI2 to perform a training operation. The determination circuit 822 may generate an error signal ERR32 by determining whether the second output symbol SO2 is the same as the second input symbol SI2. When the second output symbol SO2 and the second input symbol SI2 are substantially the same as each other, the determination circuit 822 might not generate the error signal ERR32. When the second output symbol SO2 and the second input symbol SI2 are different from each other, the determination circuit 822 may generate the error signal ERR32.

While certain embodiments have been described above, it will be understood to those skilled in the art that the embodiments described are by way of example only. Accordingly, the semiconductor apparatus and the semiconductor system capable of performing a training operation should not be limited based on the described embodiments. Rather, the semiconductor apparatus and the semiconductor system capable of performing a training operation described herein should only be limited in light of the claims that follow when taken in conjunction with the above description and accompanying drawings.

What is claimed is:

1. A semiconductor apparatus comprising:
a Pseudo Random Binary Sequence (PRBS) generation circuit configured to generate a PRBS signal;
a first data input and output circuit including a first scramble circuit configured to scramble, based on a first scramble code, the PRBS signal to generate a first output data signal; and
a second data input and output circuit including a second scramble circuit configured to scramble, based on a second scramble code having different value from the first scramble code, the PRBS signal to generate a second output data signal,
wherein the semiconductor apparatus is configured to generate the first scramble code and the second scramble code based on a command address signal.

2. The semiconductor apparatus of claim 1,
wherein the first data input and output circuit is configured to generate a first data stream based on the first output data signal and configured to transmit the first data stream to a first data transmission line, and
wherein the second data input and output circuit is configured to generate a second data stream based on the second output data signal and configured to transmit the second data stream to a second data transmission line.

3. The semiconductor apparatus of claim 1,
wherein the first data input and output circuit is configured to receive a first data stream through a first data transmission line and configured to generate a first input data signal based on the first data stream, and
wherein the first data input and output circuit includes a determination circuit configured to compare the first input data signal with the first output data signal to generate an error signal.

4. The semiconductor apparatus of claim 3, wherein the first data input and output circuit further includes a first de-scramble circuit configured to de-scramble the first input data signal to generate normal data.

5. The semiconductor apparatus of claim 1,
wherein the second data input and output circuit is configured to receive a second data stream through a second data transmission line and configured to generate a second input data signal based on the second data stream, and
wherein the second data input and output circuit includes a determination circuit configured to compare the second input data signal with the second output data signal to generate an error signal.

6. The semiconductor apparatus of claim 5, wherein the second data input and output circuit further includes a second de-scramble circuit configured to de-scramble the second input data signal to generate normal data.

7. The semiconductor apparatus of claim 1,
wherein the first data input and output circuit further includes a selection circuit configured to output, based on a mode signal, one of normal data and the PRBS signal, and
wherein the first scramble circuit is configured to scramble the output signal from the selection circuit to generate the first output data signal.

8. The semiconductor apparatus of claim 1,
wherein the second data input and output circuit further includes a selection circuit configured to output, based on a mode signal, one of normal data and the PRBS signal, and
wherein the second scramble circuit is configured to scramble the output signal from the selection circuit to generate the second output data signal.

9. The semiconductor apparatus of claim 1,
further comprising a data encoding circuit configured to encode the first output data signal and the second output data signal to generate a first output symbol and a second output symbol,
wherein the first data input and output circuit is configured to generate, based on the first output symbol, a first Pulse Amplitude Modulation (PAM) signal and configured to transmit the first PAM signal to the first data transmission line, and
wherein the second data input and output circuit is configured to generate, based on the second output symbol, a second PAM signal and configured to transmit the second PAM signal to the second data transmission line.

10. The semiconductor apparatus of claim 9, wherein each of the first PAM signal and the second PAM signal is one of PAM 3, having three distinct voltage levels, and PAM 4, having four distinct voltage levels.

11. The semiconductor apparatus of claim 9,
wherein the first data input and output circuit is configured to receive the first PAM signal through the first data transmission line and configured to generate a first input symbol based on the first PAM signal,
wherein the second data input and output circuit is configured to receive the second PAM signal through the second data transmission line and configured to generate a second input symbol based on the second PAM signal, and
further comprising a data decoding circuit configured to decode the first input symbol and the second input symbol to generate a first input data signal and a second input data signal.

12. A semiconductor system comprising:
a first semiconductor apparatus; and
a second semiconductor apparatus coupled to the first semiconductor apparatus through a first data transmission line and a second data transmission line,
wherein the first semiconductor apparatus includes:
a first Pseudo Random Binary Sequence (PRBS) generation circuit configured to generate a PRBS signal;
a first data input and output circuit coupled to the first data transmission line and configured to be assigned with a first scramble code and configured to scramble, based on the first scramble code, the PRBS signal to generate a first output data signal, and configured to generate a first data stream based on the first output data signal and to transmit the first data stream to the second semiconductor apparatus through the first data transmission line, during a first operation; and a second data input and output circuit coupled to the second data transmission line and configured to be assigned with a second scramble code and configured to scramble, based on the second scramble code, the PRBS signal to generate a second output data signal, and configured to generate a second data stream based on the second output data signal and to transmit the second data stream to the second semiconductor apparatus through the second data transmission line, during the first operation.

13. The semiconductor system of claim 12, wherein the second semiconductor apparatus includes:

a second PRBS generation circuit configured to generate the PRBS signal;

a third data input and output circuit coupled to the first data transmission line and configured to be assigned with the first scramble code and configured to scramble, based on the first scramble code, the PRBS signal to generate a third output data signal; and a fourth data input and output circuit coupled to the second data transmission line and configured to be assigned with the second scramble code and configured to scramble, based on the second scramble code, the PRBS signal to generate a fourth output data signal.

14. The semiconductor system of claim 13, wherein the third data input and output circuit is configured to generate a third input data signal based on the first data stream and configured to compare the third input data signal with the third output data signal, during the first operation.

15. The semiconductor system of claim 13, wherein the fourth data input and output circuit is configured to generate a fourth input data signal based on the second data stream and configured to compare the fourth input data signal with the fourth output data signal, during the first operation.

16. The semiconductor system of claim 13, wherein the third data input and output circuit is configured to generate the first data stream based on the third output data signal and configured to transmit the first data stream to the first semiconductor apparatus through the first data transmission line, during a second operation, and wherein the fourth data input and output circuit is configured to generate the second data stream based on the fourth output data signal and configured to transmit the second data stream to the second semiconductor apparatus through the second data transmission line, during the second operation.

17. The semiconductor system of claim 16, wherein the first data input and output circuit is configured to generate a first input data signal based on the first data stream and configured to compare the first input data signal with the first output data signal, during the second operation.

18. The semiconductor system of claim 16, wherein the second data input and output circuit is configured to generate a second input data signal based on the second data stream and configured to compare the second input data signal with the second output data signal, during the second operation.

19. A semiconductor apparatus comprising:

a Pseudo Random Binary Sequence (PRBS) generation circuit configured to generate a PRBS signal;

a first data input and output circuit configured to be assigned with a first scramble code, configured to scramble, based on a first part of the first scramble code, the PRBS signal to generate a first scrambled signal and configured to scramble, based on a second part of the first scramble code, the first scrambled signal to generate a first output data signal, the first data input and output circuit configured to generate a data stream based on the first output data signal and to transmit the first data stream through a first data transmission line; and a second data input and output circuit configured to be assigned with a second scramble code, configured to scramble, based on a first part of the second scramble code, the PRBS signal to generate a second scrambled signal and configured to scramble, based on a second part of the second scramble code, the second scrambled signal to generate a second output data signal, the second data input and output circuit configured to generate a data stream based on the second output data signal and to transmit the second data stream through a second data transmission line.

20. The semiconductor apparatus of claim 19, wherein the PRBS generation circuit includes:

a first PRBS generator configured to generate a first PRBS pattern;

a second PRBS generator configured to generate a second PRBS pattern; and a selection circuit configured to output, as the PRBS signal, one of the first PRBS pattern and the second PRBS pattern according to a selection signal.

21. The semiconductor apparatus of claim 19, wherein the first data input and output circuit includes:

a first scrambler configured to scramble, according to a first scheme, the PRBS signal based on the first part of the first scramble code to generate the first scrambled signal; and a second scrambler configured to scramble, according to a second scheme, the first scrambled signal based on the second part of the first scramble code to generate the first output data signal.

22. The semiconductor apparatus of claim 21, wherein the second data input and output circuit includes:

a third scrambler configured to scramble, according to the first scheme, the PRBS signal based on the first part of the second scramble code to generate the second scrambled signal; and a fourth scrambler configured to scramble, according to the second scheme, the second scrambled signal based on the second part of the second scramble code to generate the second output data signal.

23. The semiconductor apparatus of claim 22, wherein the first data input and output circuit further includes a fifth scrambler configured to scramble, according to a third scheme, the first scrambled signal based on a third part of the first scramble code, and wherein the second scrambler is configured to scramble an output signal of the fifth scrambler to generate the first output data signal.

24. The semiconductor apparatus of claim 23, wherein the second data input and output circuit further includes a sixth scrambler configured to scramble, according to the third scheme, an output signal of the third scrambler based on a third part of the second scramble code, and wherein the fourth scrambler is configured to scramble an output signal of the sixth scrambler to generate the second output data signal.

25. A semiconductor apparatus comprising:

a Pseudo Random Binary Sequence (PRBS) generation circuit configured to generate a PRBS signal;

a first data input and output circuit configured to be assigned with a first scramble code and configured to scramble, based on at least a part of the first scramble code, the PRBS signal to generate a first output data signal, the first data input and output circuit configured to generate, based on a first output symbol, a first Pulse Amplitude Modulation (PAM) signal and to transmit the first PAM signal to a first data transmission line;

a second data input and output circuit configured to be assigned with a second scramble code and configured to scramble, based on at least a part of the second scramble code, the PRBS signal to generate a second output data signal, the second data input and output circuit configured to generate, based on a second output symbol, a second PAM signal and to transmit the second PAM signal to a second data transmission line; and a data encoding circuit configured to encode the first output data signal and the second output data signal to generate the first output symbol and the second output symbol.

26. The semiconductor apparatus of claim 25, wherein the first data input and output circuit is configured to receive the first PAM signal transmitted through the first data transmission line and to generate a first input symbol, wherein the second data input and output circuit is configured to receive the second PAM signal transmitted through the second data transmission line to generate a second input symbol, and further comprising a data decoding circuit configured to decode the first input symbol and the second input symbol to generate a first input data signal and a second input data signal.

27. The semiconductor apparatus of claim 26, wherein the first data input and output circuit is configured to compare the first output data signal with the first input data signal, and wherein the second data input and output circuit is configured to compare the second output data signal with the second input data signal.

28. The semiconductor apparatus of claim 25, wherein the first data input and output circuit includes a first scrambler configured to scramble, based on at least the part of the first scramble code, the PRBS signal to generate the first output data signal, and wherein the second data input and output circuit includes a second scrambler configured to scramble, based on at least the part of the second scramble code, the PRBS signal to generate the second output data signal.

* * * * *